(12) United States Patent
Setele et al.

(10) Patent No.: US 12,267,978 B2
(45) Date of Patent: Apr. 1, 2025

(54) ELECTRONICS BOX FOR IN-FLIGHT ENTERTAINMENT SYSTEM

(71) Applicant: Panasonic Avionics Corporation, Irvine, CA (US)

(72) Inventors: Mark Allen Setele, Ladera Ranch, CA (US); Andrew Barnes, Mission Viejo, CA (US); Yichao Jiang, Irvine, CA (US)

(73) Assignee: Panasonic Avionics Corporation, Irvine, CA (US)

( * ) Notice: Subject to any disclaimer, the term of this patent is extended or adjusted under 35 U.S.C. 154(b) by 341 days.

(21) Appl. No.: 17/663,195

(22) Filed: May 12, 2022

(65) Prior Publication Data

US 2023/0371195 A1 Nov. 16, 2023

(51) Int. Cl.
| | |
|---|---|
| *H05K 7/14* | (2006.01) |
| *B64D 11/00* | (2006.01) |
| *H05K 5/03* | (2006.01) |
| *H05K 7/20* | (2006.01) |

(52) U.S. Cl.
CPC ..... *H05K 7/1427* (2013.01); *B64D 11/00155* (2014.12); *H05K 5/03* (2013.01); *H05K 7/20863* (2013.01)

(58) Field of Classification Search
None
See application file for complete search history.

(56) References Cited

U.S. PATENT DOCUMENTS

| | | | |
|---|---|---|---|
| 5,610,493 | A | 3/1997 | Wieloch |
| 5,873,406 | A | 2/1999 | Horng |
| 6,240,414 | B1 | 5/2001 | Beizer et al. |

(Continued)

FOREIGN PATENT DOCUMENTS

| | | |
|---|---|---|
| CN | 117062355 A | 11/2023 |
| CN | 117062391 A | 11/2023 |

(Continued)

OTHER PUBLICATIONS

Extended European Search Report from European Patent Application No. 23178164.2 dated Aug. 2, 2023.

(Continued)

*Primary Examiner* — James Wu
*Assistant Examiner* — Christopher L Augustin
(74) *Attorney, Agent, or Firm* — Perkins Coie LLP

(57) ABSTRACT

This patent document describes techniques are related to an apparatus for an electronics box for an in-flight entertainment system. The electronics box comprises: a first module including a first group of electronic components for the in-flight entertainment system and having a housing accommodating a first board on which the first group of electronic components are disposed; and a second module detachably placed over the first module and having a second board on which a second group of electronic components for the in-flight entertainment system are disposed, the second board covered by a frame that forms a sealed enclosure with the housing, and wherein the first group of electronic components and the second group of electronic components are configured to provide power or data to at least one of the in-flight entertainment system that is located in a commercial passenger vehicle.

19 Claims, 23 Drawing Sheets

(56) References Cited

U.S. PATENT DOCUMENTS

| | | | |
|---|---|---|---|
| 6,249,913 B1 | 6/2001 | Galipeau et al. | |
| 6,899,390 B2 | 5/2005 | Sanfrod et al. | |
| 7,814,515 B2 | 10/2010 | Ohyama et al. | |
| 7,836,472 B2 | 11/2010 | Brady, Jr. et al. | |
| 7,984,190 B2 | 7/2011 | Rhoads | |
| 8,031,470 B2 | 10/2011 | Nelson et al. | |
| 8,176,363 B2 | 5/2012 | Zlotnick | |
| 8,649,161 B2 | 2/2014 | Kato | |
| 8,782,637 B2 | 7/2014 | Khalid | |
| 9,015,775 B2 | 4/2015 | Perlman et al. | |
| 9,041,670 B2 | 5/2015 | Kobayashi | |
| 9,083,581 B1 | 7/2015 | Addepalli et al. | |
| 9,185,822 B2 * | 11/2015 | Shanbhogue | H05K 7/142 |
| 9,247,279 B2 * | 1/2016 | Bleacher | H04N 21/6405 |
| 9,363,915 B1 * | 6/2016 | Berkenbush | H05K 7/20563 |
| 9,509,937 B2 | 11/2016 | Easterling et al. | |
| 9,961,373 B2 | 5/2018 | Margis et al. | |
| 10,097,603 B2 | 10/2018 | Watson et al. | |
| 10,256,646 B2 | 4/2019 | Suen et al. | |
| 10,348,832 B2 | 7/2019 | Bedekar | |
| 10,455,740 B1 | 10/2019 | Engelhardt et al. | |
| 10,631,436 B1 | 4/2020 | Larsen et al. | |
| 10,897,652 B1 | 1/2021 | Atkins et al. | |
| 10,966,345 B2 | 3/2021 | Chen et al. | |
| 11,102,519 B2 | 8/2021 | Barnes et al. | |
| 11,134,591 B2 | 9/2021 | Chen et al. | |
| 11,606,583 B1 | 3/2023 | Jiang et al. | |
| 2006/0174285 A1 | 8/2006 | Brady, Jr. et al. | |
| 2007/0106771 A1 | 5/2007 | Lucash et al. | |
| 2007/0250873 A1 | 10/2007 | Ohyama et al. | |
| 2008/0016081 A1 | 1/2008 | MacMillan et al. | |
| 2008/0016196 A1 | 1/2008 | MacMillan et al. | |
| 2008/0303957 A1 * | 12/2008 | Soper | H04N 21/2146 348/837 |
| 2009/0073659 A1 | 3/2009 | Peng | |
| 2009/0310309 A1 | 12/2009 | Nelson et al. | |
| 2010/0214738 A1 | 8/2010 | Wang | |
| 2012/0112694 A1 | 5/2012 | Frisch et al. | |
| 2012/0233610 A1 | 9/2012 | Madre | |
| 2013/0093958 A1 | 4/2013 | Yoshikawa | |
| 2013/0144487 A1 | 6/2013 | Suzuki et al. | |
| 2014/0032660 A1 | 1/2014 | Nguyen | |
| 2014/0059184 A1 | 2/2014 | Bird et al. | |
| 2014/0074918 A1 | 3/2014 | Wang et al. | |
| 2014/0366125 A1 | 12/2014 | Murata et al. | |
| 2015/0256580 A1 | 9/2015 | Morton et al. | |
| 2015/0334441 A1 | 11/2015 | Sukegawa et al. | |
| 2016/0055011 A1 | 2/2016 | Choi et al. | |
| 2016/0335108 A1 | 11/2016 | Ryu et al. | |
| 2016/0344792 A1 | 11/2016 | Sinivaara | |
| 2018/0034911 A1 | 2/2018 | Bedekar | |
| 2019/0118950 A1 | 4/2019 | Pozzi et al. | |
| 2019/0320555 A1 | 10/2019 | Flavin et al. | |
| 2019/0373762 A1 * | 12/2019 | Moser | H05K 5/0004 |
| 2021/0011534 A1 | 1/2021 | Yin et al. | |
| 2021/0240365 A1 | 8/2021 | Bates et al. | |
| 2021/0344258 A1 * | 11/2021 | Singh | H05K 1/144 |
| 2023/0171917 A1 * | 6/2023 | Wang | H05K 7/2039 |
| 2023/0371197 A1 | 11/2023 | Setele et al. | |
| 2023/0403414 A1 | 12/2023 | Setele et al. | |

FOREIGN PATENT DOCUMENTS

| | | |
|---|---|---|
| DE | 4340280 A1 | 3/1995 |
| EP | 4340556 A1 | 3/2024 |
| EP | 4340561 A1 | 3/2024 |
| WO | 2021115540 A1 | 6/2021 |
| WO | 2021121629 A1 | 6/2021 |

OTHER PUBLICATIONS

Extended European Search Report from European Patent Application No. 2317200.9 dated Feb. 16, 2024.

Extended European Search Report from European Patent Application No. 23173221.5 dated Feb. 16, 2024.

* cited by examiner

ELECTRONICS BOX FOR IN-FLIGHT ENTERTAINMENT SYSTEM

TECHNICAL FIELD

This document is generally related to systems, methods, and apparatus to improve passenger experiences during a travel in a commercial passenger vehicle such as airplanes, passenger train buses, cruise ships, and others.

BACKGROUND

Commercial travel has evolved with the increasing popularity of personal electronic devices (PED) that passengers carry on board, as well as media play devices provided in commercial passenger vehicles. Passenger travel experiences for travels oftentimes rely on wireless connections provided during travel in commercial passenger vehicles. Thus, systems in commercial passenger vehicles can be designed to provide passengers with a positive travel experience by improving wireless connections.

SUMMARY

This patent document describes various implementations of an electronics box for an in-flight entertainment system and methods for providing the electronics box.

In one aspect, an electronics box for an in-flight entertainment system is disclosed. The electronics box comprises: a sealed enclosure including electronic components for the in-flight entertainment system disposed in a commercial passenger vehicle; and a cooling structure disposed on a surface of the sealed enclosure and includes: a fan introducing air from outside into the cooling structure, the air creating an air passage that is external to the sealed enclosure and extending along the surface of the sealed enclosure; one or more heat dissipation elements disposed in the air passage and configured to dissipate heat generated by the electronic components; and a duct cover covering the fan and the one or more heat dissipation elements and having an air inlet through which the air enters into the cooling structure.

In another aspect, an electronics box for an in-flight entertainment system is disclosed. The electronics box comprises: a first board including a first group of electronic components disposed on the first board and configured to provide power to the in-flight entertainment system disposed in a commercial passenger vehicle; a second board disposed over the first board and including a second group of electronic components disposed on the second board and configured to provide data to the in-flight entertainment system disposed in a commercial passenger vehicle; a cooling structure disposed over the second board and including a fan configured to introduce air from outside into the cooling structure and a heat dissipation element disposed in an air passage through which the air travels in the cooling structure and configured to dissipate heat that is transferred through a thermal conductive structure from the second group of electronic components.

In another aspect, a method for providing an electronics box for an in-flight entertainment system is provided. The method comprises: configuring a sealed enclosure including electronic components for the in-flight entertainment system disposed in a commercial passenger vehicle, the electronic components configured to provide power or data to the in-flight entertainment system; disposing a cooling structure on a surface of the sealed enclosure, and wherein the cooling structure includes: a fan introducing air from outside into the cooling structure, the air creating an air passage that is external to the sealed enclosure and extending along the surface of the sealed enclosure; one or more heat dissipation elements disposed in the air passage and configured to dissipate heat generated by the electronic components; and a plenum cover covering the fan and the one or more heat dissipation elements and configured to force the air flowing along the air passage, the plenum cover having an air inlet through which the air enters into the cooling structure.

In another aspect, an electronics box for an in-flight entertainment system is disclosed. The electronics box comprises: a first module including a first group of electronic components for the in-flight entertainment system and having a housing accommodating a first board on which the first group of electronic components; and a second module detachably placed over the first module and having a second board on which a second group of electronic components for the in-flight entertainment system are disposed, the second board covered by a frame that forms a sealed enclosure with the housing, and wherein the first group of electronic components and the second group of electronic components are configured to provide power or data to the in-flight entertainment system that is located in the commercial passenger vehicle.

In another aspect, an electronics box for an in-flight entertainment system is disclosed. The electronics box comprises: a housing configured to accommodate a first electronic component and a second electronic component that are disposed on a first board and configured to support the in-flight entertainment system; a third electronic component and a fourth electronic component that are disposed on a second board and configured to supply data to the in-flight entertainment system, the second board placed apart from the first board and arranged to face in an outward direction of the electronics box; and a frame covering the second board and having a top surface and side surfaces that are detachably attached to the housing, and wherein the first electronic component and the second electronic component are configured to supply power to the third electronic component and the fourth electronic component that are configured to provide data or power to at least one of an in-flight entertainment equipment and a passenger device that is located in the commercial passenger vehicle.

In another aspect, a method for providing an electronics box for an in-flight entertainment system is provided. The method comprises: configuring a power supply module having a first board on which a first group of electronic components for the in-flight entertainment system are disposed; placing a processor module over the power supply module, the processor module having a second board on which a second group of electronic components for the in-flight entertainment system are disposed, and wherein the first group of electronic components and the second group of electronic components are configured to provide power or data to the in-flight entertainment system that is located in the commercial passenger vehicle.

In yet another exemplary embodiment, a device that is configured or operable to perform the above-described methods is disclosed.

The above and other aspects and their implementations are described in greater detail in the drawings, the descriptions, and the claims.

DETAILED DESCRIPTION

Various examples of the disclosed technology relate to an electronics box for an in-flight entertainment (IFE) system disposed in a commercial passenger vehicle. The electronics boxes are disposed at various locations such as underneath passenger seats or inside certain portions of passenger seats or other areas in close proximity to the passenger seats. The electronics box includes electronic components for supporting the IFE system and may refer to containers used to accommodate such electronic components.

Figure 19A:
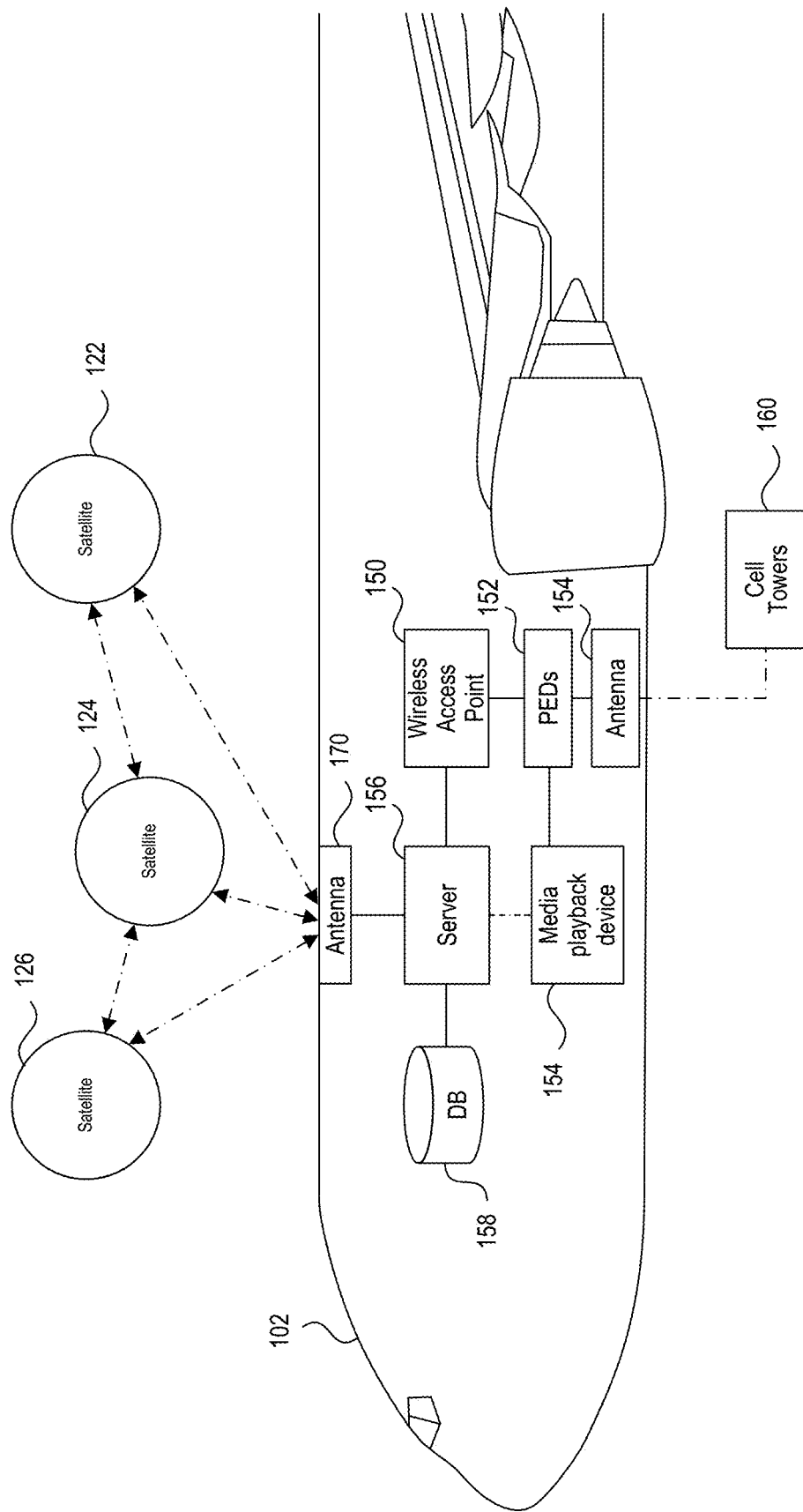
FIG. 19A shows an example of an in-flight entertainment system installed in an airplane.

FIG. 19A shows an example of an IFE system installed in an airplane. In this example, the IFE system includes both media playback device provided at each passenger seat and the PEDs carried by the travelers. The media playback devices are configured with capabilities for video, audio, and internet communications and the PEDs include smart phones, tablet computers, laptop computers, and other portable electronic devise. Referring to FIG. 19A, the in-flight service system includes a server 156, media playback devices 154, and a PED (personal electronic device) 152 that are located in the airplane 102. The server 156 is communicably coupled with the media playback devices 154 and the PEDs 152. The communication between the server 156 and the onboard devices including the media playback devices 154 and the PEDs 152 is either realized by wired connections or wireless connections. In some implementations, the communication among the server 106, the media playback devices 104, and the PEDs 152 are achieved through the antenna 114 to and from ground-based cell towers by, for example, a provision of network plugs at the seat for plugging PEDs 152 to a wired onboard local area network. In some other implementations, the communications among the server 156, the media playback devices 154, and the PEDs 152 are achieved through the antenna 170 to and from satellites 122, 124, 126 in an orbit, e.g. via a cellular network utilizing one or more onboard base station(s), Wi-Fi utilizing the wireless access point 150, and/or Bluetooth.

Figure 19B:
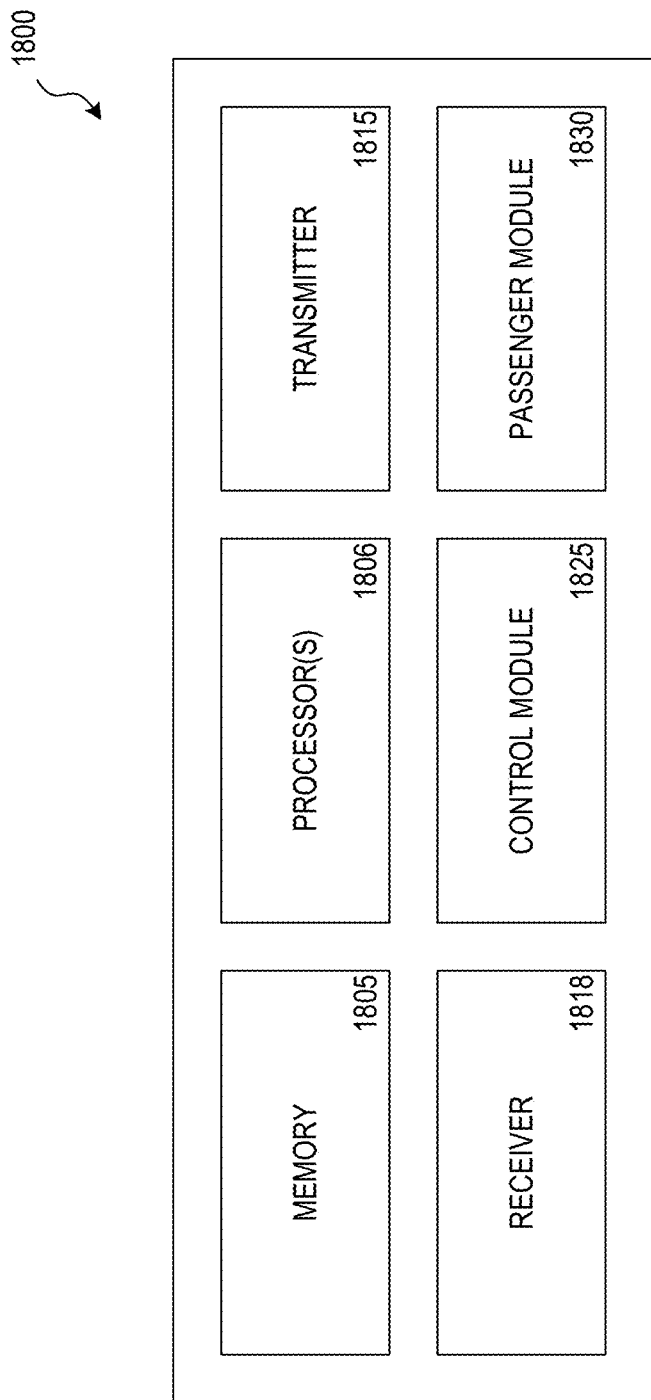
FIG. 19B shows an example of a block diagram of a server of an in-flight entertainment system.

FIG. 19B shows an example of a block diagram of a server of an in-flight entertainment system. The server 1800 includes at least one processor 1806, a memory 1805, a transmitter 1815, a receiver 1818, a control module 1825, or a passenger module 1830. The memory 1805 is an electronic holding place or storage for information or instructions so that the information or instructions can be accessed by the processor 1806. The instructions upon execution by the processor 1806 configure the server 1800 to perform the operations. The processor 1806 operably couples with the memory 1805, transmitter 1815, the receiver 1818, the control module 1825, and the passenger module 1830, etc. to receive, to send, and to process information and to control the operations of the server 1800. The processor 1806 may retrieve a set of instructions from a permanent memory device such as a ROM device and copy the instructions in an executable form to a temporary memory device that is generally some form of RAM. The transmitter 1815 transmits or sends information or data to another device (e.g., another server, media playback devices 154, or PEDs 152). The receiver 1818 receives information or data transmitted or sent by another device (e.g., another server, media playback devices 154, or PEDs 152). The control module 1825 of the server 1800 is configured to perform operations to assist the IFE system, for example, by performing an analysis and/or testing for wireless connections provided in the commercial passenger vehicle.

The components included in the IFE system, e.g., the server 156, the media playback device 154, the wireless access point 150, the PEDs 152, and/or antennas 154 and 170, often require supporting hardware, cabling, wire harnesses, etc., which are collectively referred to as electronic components. The electronic components are configured to perform various functions that include video/audio processing, user interface rendering, graphic/games rendering, data storage, etc. for supporting the IFE system disposed in the passenger vehicle.

Figure 1A:
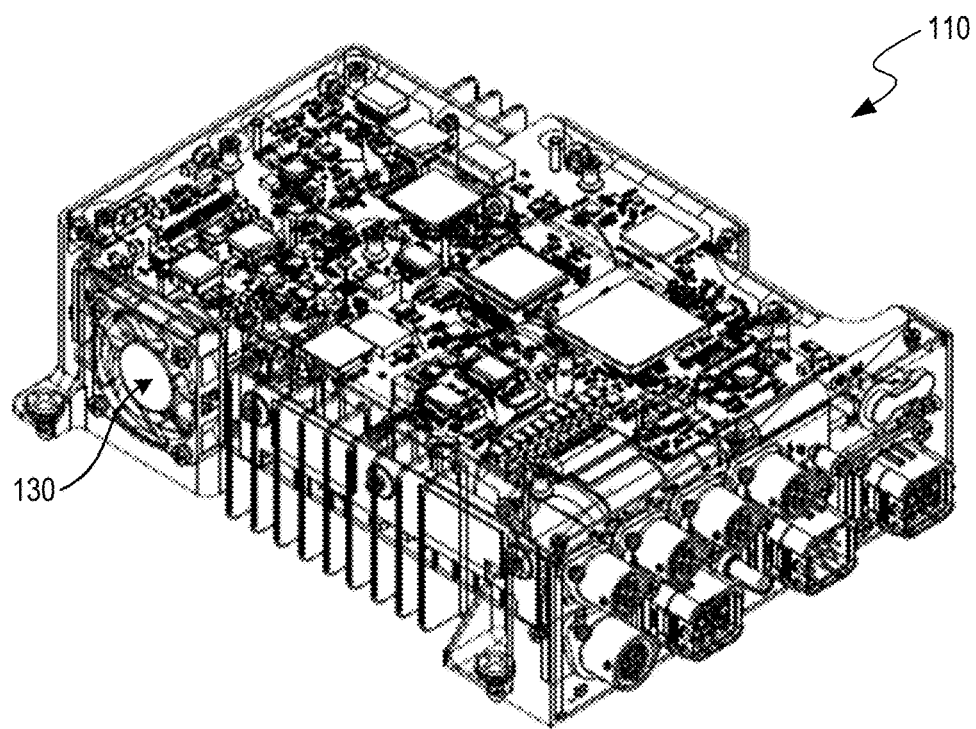
FIGS. 1A and 1B show diagrams of comparative examples of an electronics box.
Figure 1B:
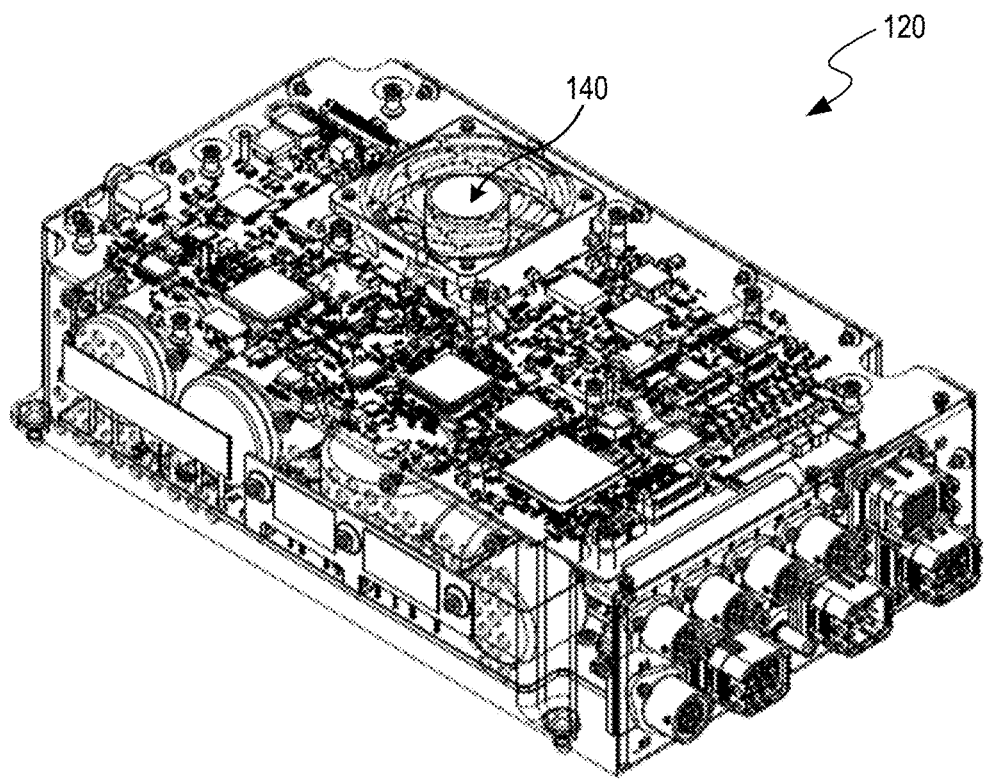

FIGS. 1A and 1B show diagrams of comparative examples of electronics boxes. Referring to the electronics boxes 110 and 120 as shown in FIGS. 1A and 1B, which correspond to the conventional electronics boxes, all internal boards and components are placed like a puzzle with inaccessible connections that are hard to access from outside. Advances in technologies sometimes require the electronic components in the electronics box to be upgraded to improve their performances, thereby providing passengers with more positive travel experience. Such upgrades may sometimes be needed to be in accordance with the changes of the related technical protocols and technical standard. Due to the complex structure and inaccessible connections of the conventional electronics boxes 110 and 120, upgrading of the electronic components were not easy. To replace the electronic components, a technician often had to disassemble a whole box. This complexity of convention designs presented a technical problem with respect to maintenance and upgrade of field-deployed boxes due to cost, time, and efforts required for such tasks.

In addition, the electronics boxes 110 and 120 have fans 130 and 140 that introduce air from outside and produce turbulent air flow moving through the electronic components inside the electronics boxes 110 and 120. This fan structure can cause not only air but also undesired substances such as dusts, hair, moisture, etc., to be introduced into the electronics box. Unwanted introduction of such foreign substances can lead to the dust collection issues and moisture and liquid intrusion issues that may deteriorate performance of the electronic components inside the electronics boxes. The current fan design also impact the board design and components placements. The risk of the liquid intrusion also limits placement options for sensitive electronic components inside the electronics box and further limits the options of where the electronics box can be installed within an airplane. Additionally, installations may require additional treatment such as coating of the sensitive electronic for waterproofing, which is expensive.

In recognition of the issues as mentioned above and additional issues existing in the conventional electronics boxes, various implementations of the disclosed technology provide new designs of an electronics box. In one advantageous aspect, such designs provide modularity, which allows easy maintenance and repair by allowing a technician to access and swap at a module level, instead of having to access individual electronic components such as passive elements of integrated circuits. The modularity allows the variances of the components (power supply, microprocessor boards, system on a module boards) to be included in the electronics box. Thus, the different components can be selected while using the same enclosures (electronics box). In another advantageous aspect, the designs provide ease of accessibility. In yet another advantageous aspect, various modules and assemblies are sealed to make them resistant to liquid or dust intrusion. In yet another advantageous aspects, cooling of the electronic components inside the electronics box is achieved by providing an arrangement of a cooling portion over electronic components that are particularly susceptible to heat issues, thereby making the electronics box more compact than conventional designs. Various implementations of the electronics box will be discussed in detail with reference to accompanying drawings.

Figure 2:
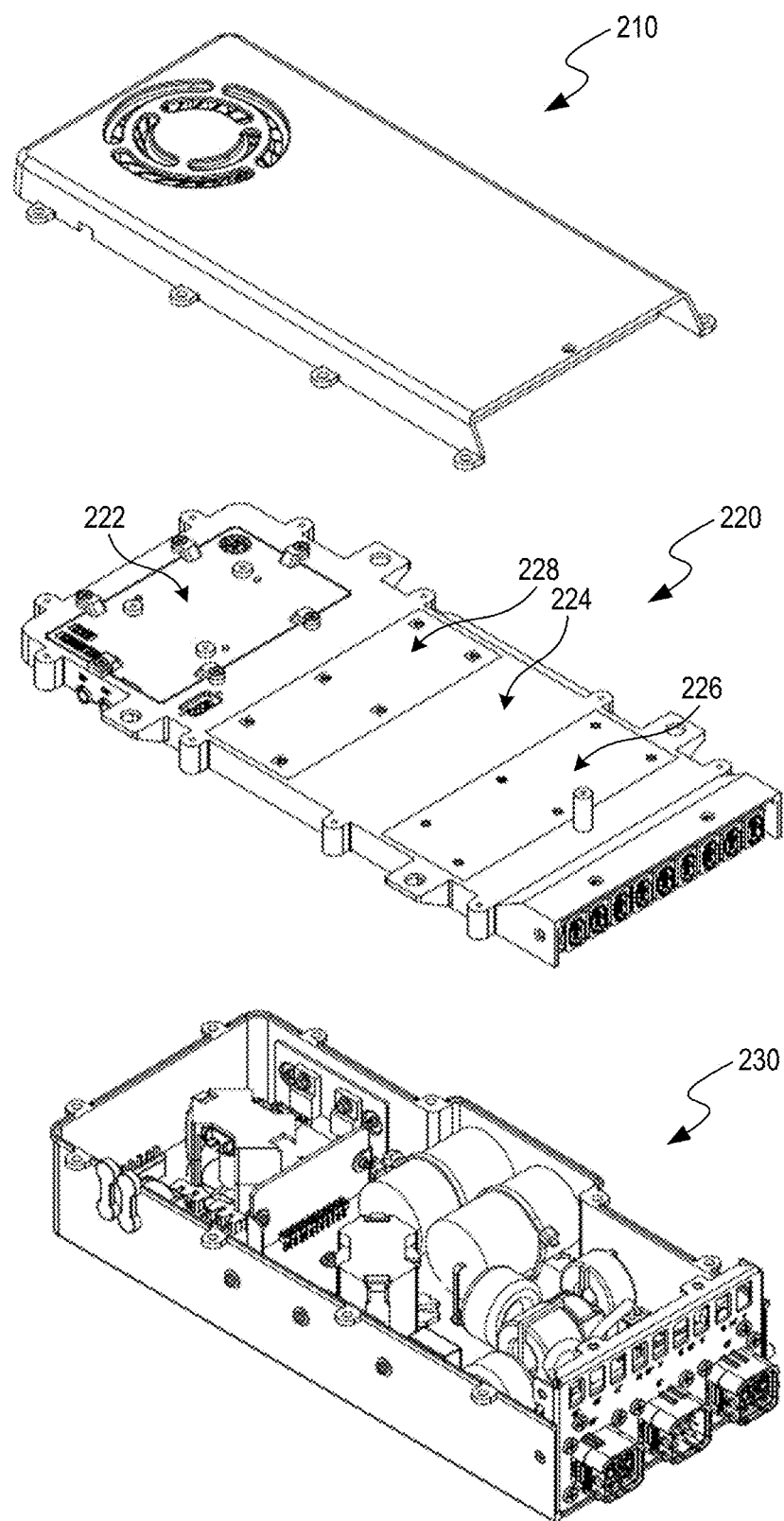
FIG. 2 shows an example of a sectional view of an electronics box based on some implementations of the disclosed technology.

FIG. 2 shows an example of a sectional view of an electronics box implementation. In FIG. 2, an electronics box 200 includes a cooling structure 210, a processor module 220, and a power supply module 230. While the implementations of the disclosed technology are described with the two separate modules, i.e., the processor module 220 and the power supply module 230 that are configured to accommodate the electronic components, the names of the modules are the examples only and are not limiting the way which electronic components are included in the which module. The placements of the electronic components, e.g., whether the electronic components are included in the processor module 220 or the power supply module 230, are based on various characteristics of the electronic components that include at least one of heat generating amounts, sensitivity to temperature, or functions of the electronic components. Thus, the processor module 220 and the power supply module 230 are provided as examples of the two distinctive elements of the electronics box 200 configured with separate main boards from each other. In FIG. 2, the processor module 220 is shown with the base frame 224 on which the memory window 222 and the receptacles 226 and 228 are provided. In the examples, the base frame 224 can be referred to as a chassis and the memory window can be referred to as a memory hatch.

Each of the cooling structure 210, the processor module 220, and the power supply module 230 can be a standalone line replaceable unit (LRU). Thus, the cooling structure 210, the processor module 220, and the power supply module 230 are detachably assembled together. In some implementations, the combination of the processor module 220 and the power supply module 230 can operate as a complete electronics box without the cooling structure 210. Thus, the cooling structure can be provided as an additional optional element that is configured to cool the heat generated by the electronic components included in the power supply module and the processor module. Since each of the cooling structure 210, the processor module 220, and the power supply module 230 is a standalone LRU, it becomes easier and more convenient to make changes to the electronics box according to protocol changes and technical developments.

Figure 3B:
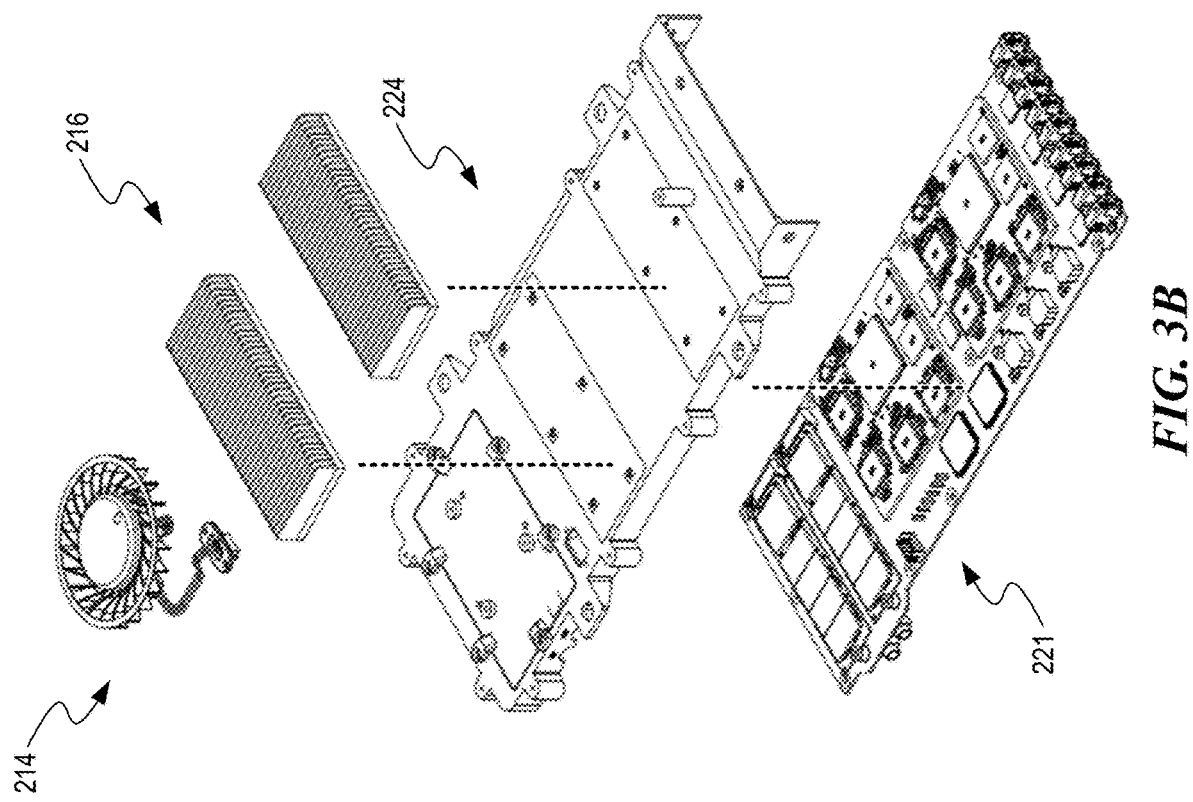
FIGS. 3A to 3E show example views that illustrate how an electronics box is assembled based on some implementations of the disclosed technology.
Figure 3A:
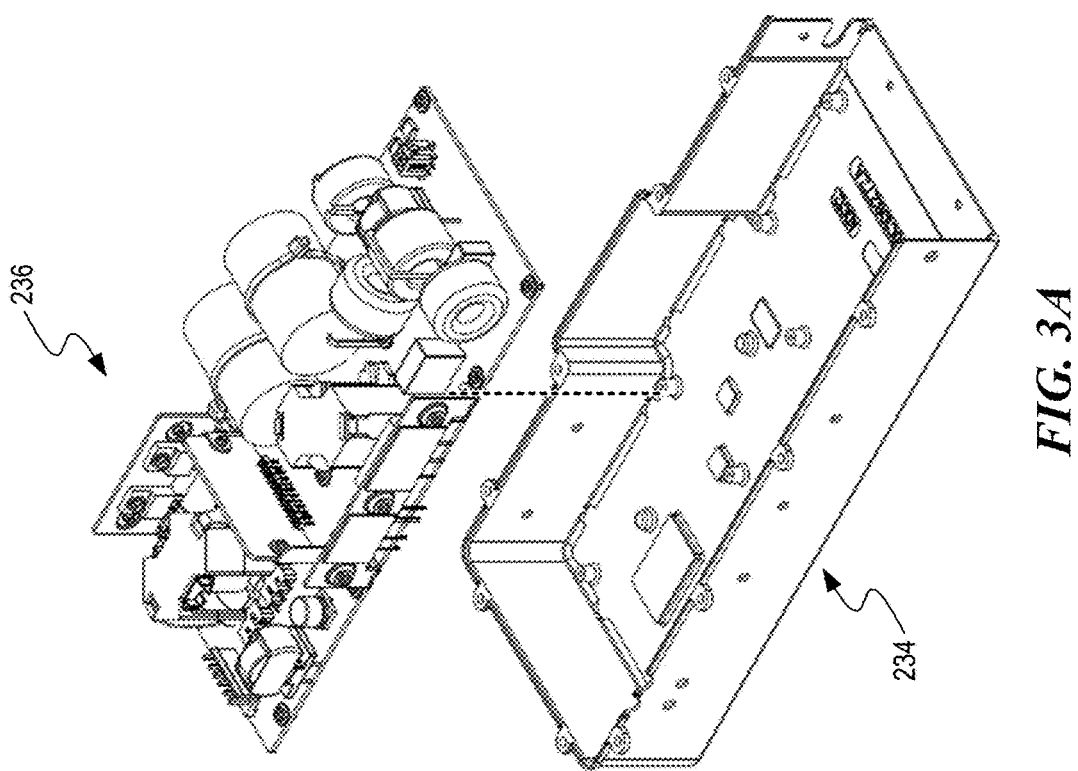
Figure 3E:
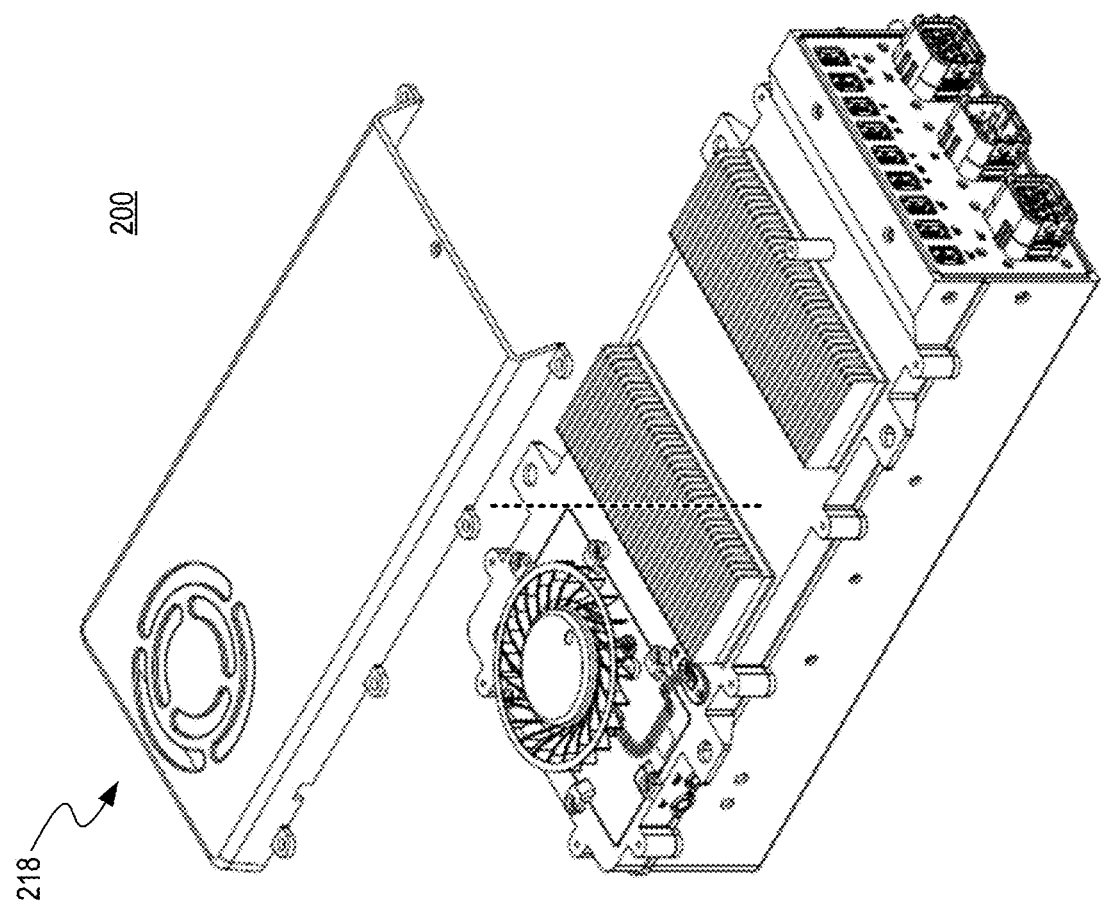
Figure 3C:
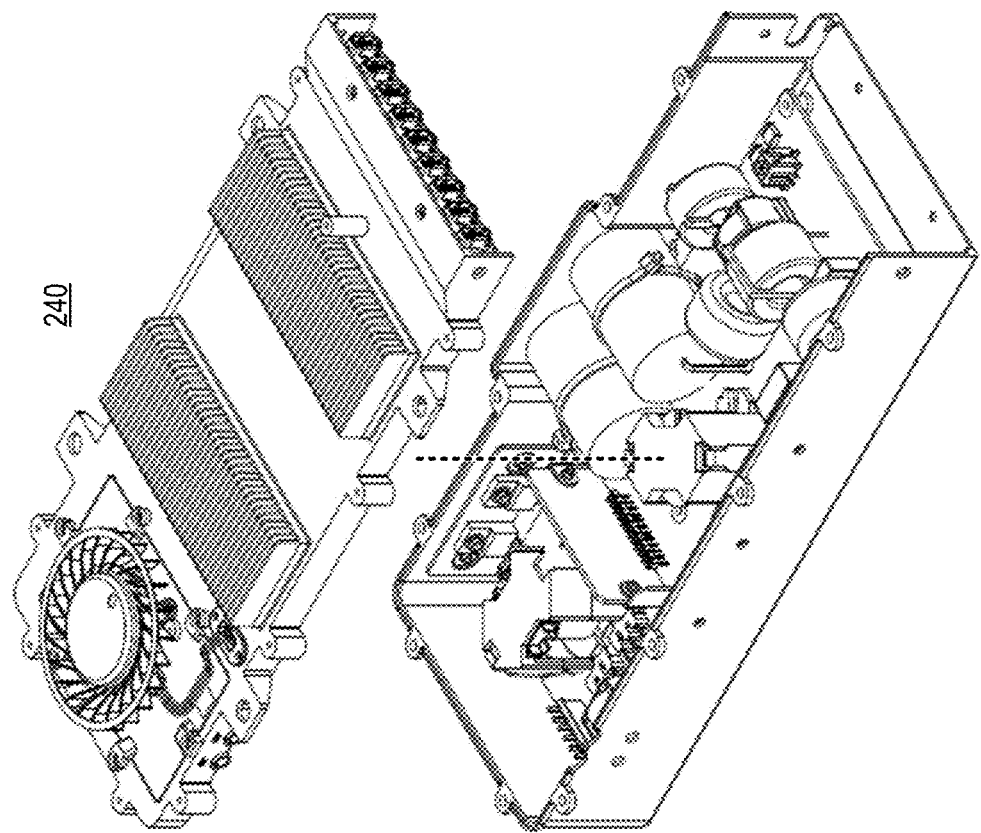
Figure 3D:
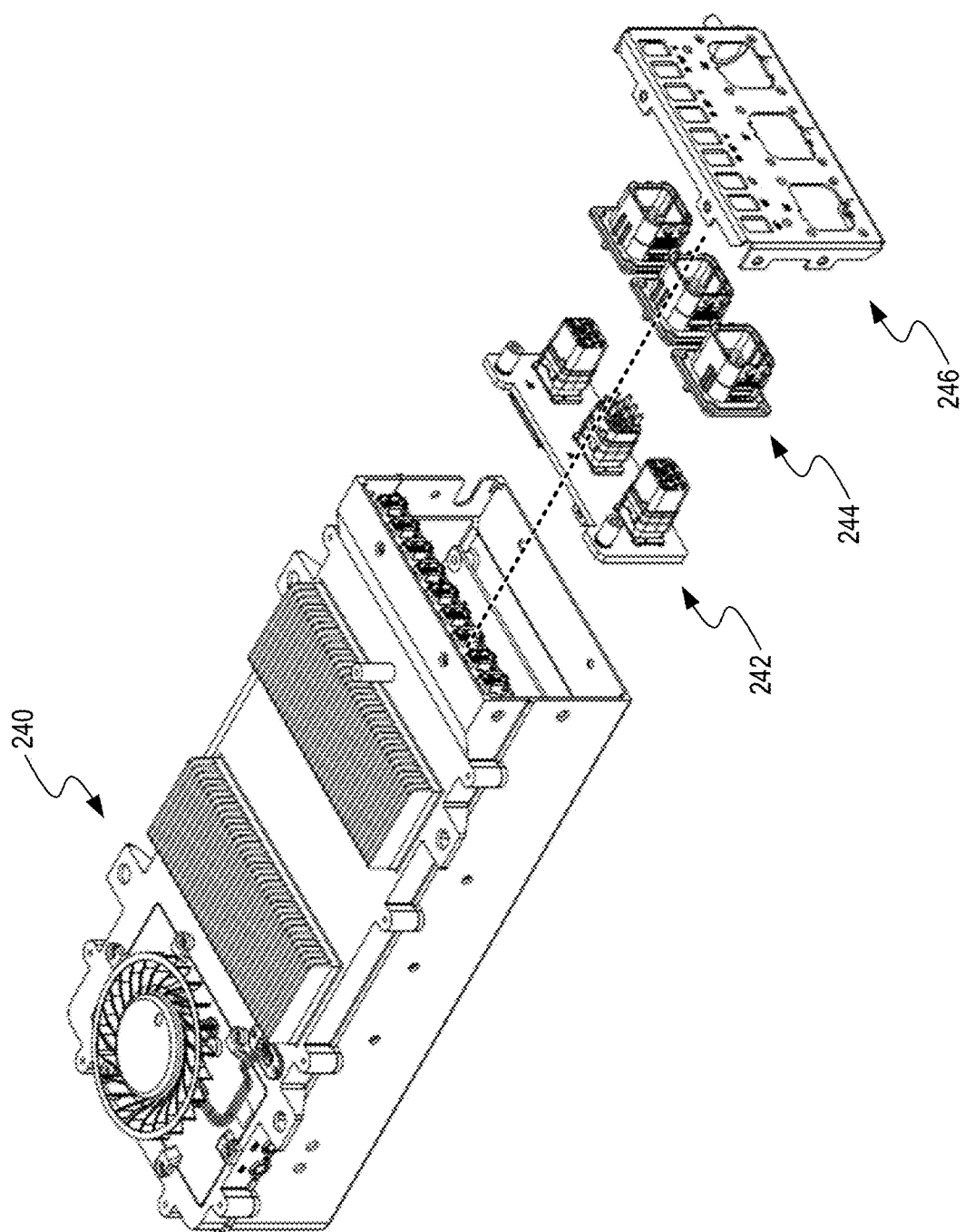

FIGS. 3A to 3E show example views that illustrate how an electronics box is assembled. In FIG. 3A, the bottom sub-assembly corresponds to the power supply module 230 that is configured with the power supply module housing 234 having a bottom surface and sidewalls and the power supply board 236. The power supply module housing 234 accommodates the power supply board 236 on which power supply components are disposed. The power supply module housing 234 may be implemented as a chassis and referred to as power chassis. In FIG. 3B, the top sub-assembly is configured with the processor module including a processor board 221 and the base frame 224 and the cooling structure 210 including a fan 214 and a heatsink 216. The base frame 224 can operate as the cover of the processor module 220 and the bottom surface on which the fan 214 and the heat sink 216 are disposed to configure the cooling structure 210. In FIG. 3C, the bottom sub-assembly and the top sub-assembly are assembled together to provide an assembled structure 240. In FIG. 3D, the input/output interface structure including the input/output board 242, the bracket 244 and the input/output cover 246 are assembled to the assembled structure 240. In FIG. 3E, a duct cover 218 is assembled, thereby completing the electronics box 200. The duct cover 218 may be referred to as the plenum cover, both duct cover and the plenum cover configured to facilitate air circulation for air by providing pathways for airflows.

Modularity of Electronics Box

Unlike the puzzle-shaped structure and inaccessible cable connections of the conventional electronics box (see FIGS. 1A and 1B), the suggested electronics box suggests a new design of the electronics box including new arrangements of the electronic components. The suggested electronics box has the benefit of the modularity by structuring the electronics box with two distinctive modules, e.g., the processor module 220 and the power supply module 230, for accommodating the electronic components. The processor module 220 and the power supply module 230 are implemented with the separate main boards and include different groups of electronic components. The placements of the electronic components, e.g., whether to put the electronic components in the processor module 220 or the power supply module 230, may be based on the various characteristics of the electronic components, for example, heat generation amounts of the electronic components, sensitivity to temperature of the electronic components, functions of the electronic components, etc.

As is further discussed in this patent document, in some implementations, the electronic components can be grouped based on heat generating characteristics such as heat generation amounts, sensitivity to temperature, etc. The electronic components which generate considerable amounts of heat and/or are more sensitive to temperature are arranged in the processor module 220 which is disposed closer to the cooling structure 210 as compared to the power supply module 230. The electronic components which generate less amounts of the heat and more tolerant to the temperature are arranged in the power supply module 230 which is disposed further away from the cooling structure as compared to the processor module 220. While there is a space limitation inside the electronics box, arranging the processor module 220 including major heat generating components to be closer to the cooling structure 210 while arranging the remaining components in the power supply module 230 can make it possible to more efficiently cool the heat generated by the electronic components by reducing the distance for the heat transfer from those major heat generating components to the cooling structure 210. The cooling aspect of the electronics box will be further discussed in detail later in this patent document.

Figure 4A:
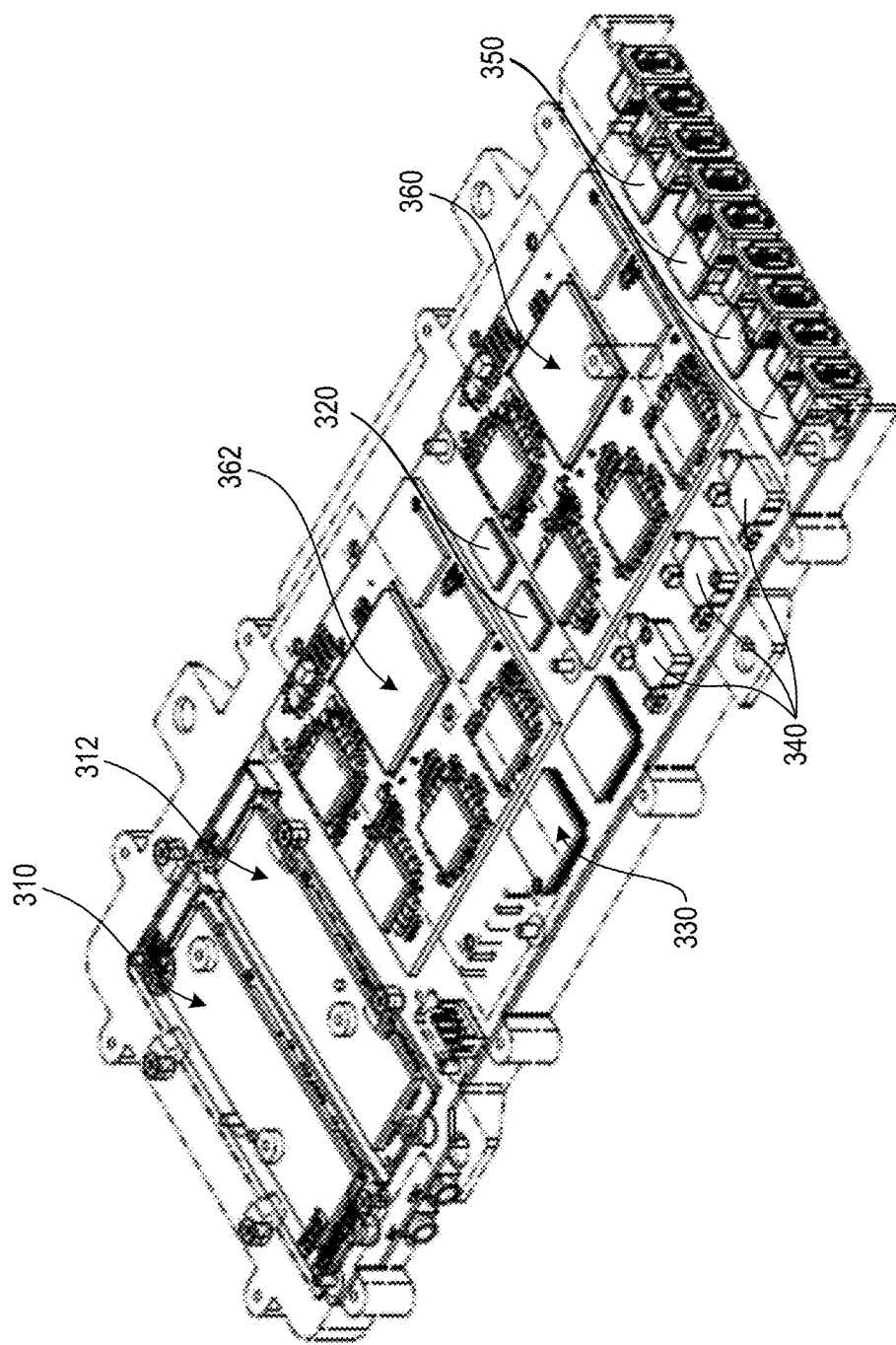
FIGS. 4A and 4B show example views of a processor module based on some implementations of the disclosed technology.
Figure 4B:
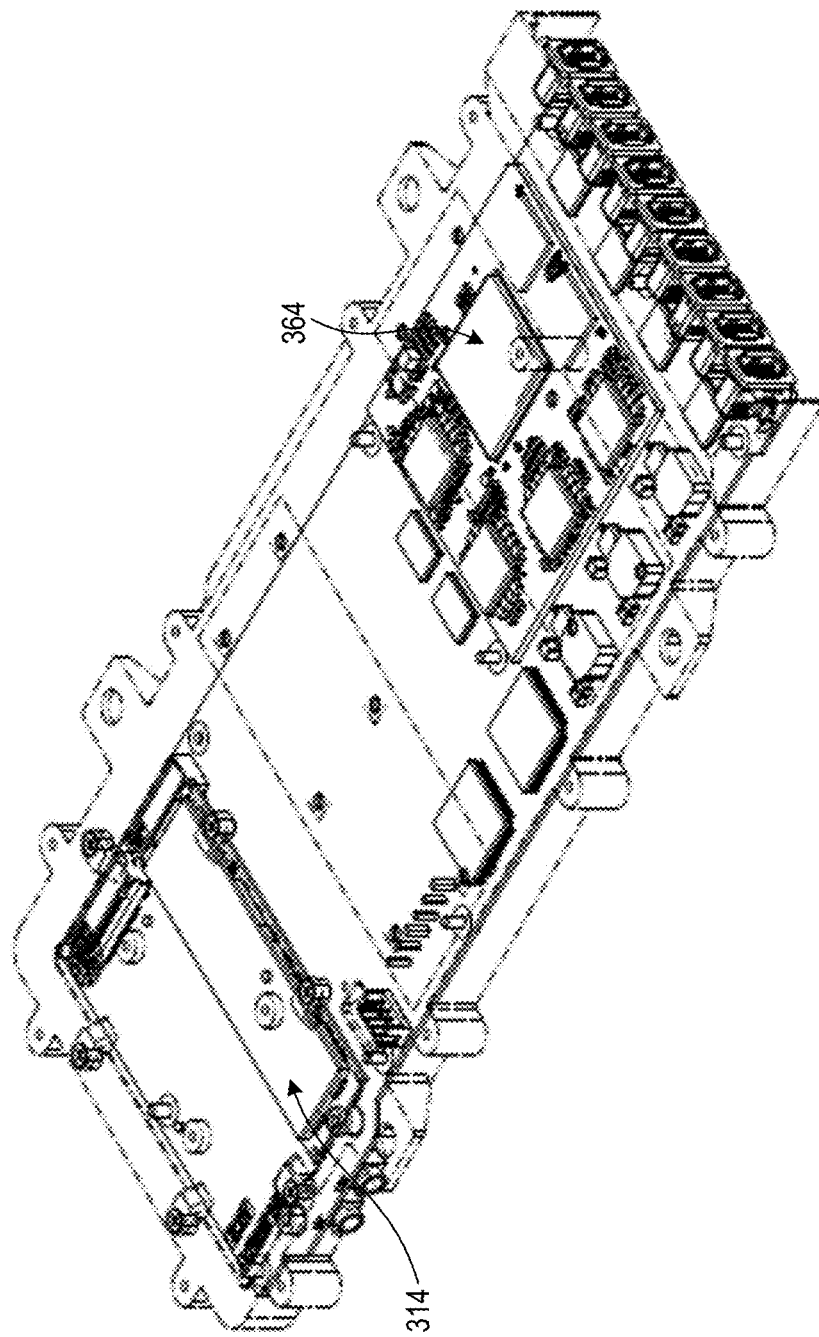

FIGS. 4A and 4B show example views of a processor module based on some implementations of the disclosed technology. The processor module as shown in FIGS. 4A and 4B corresponds to the processor module 220 as shown in FIG. 3B. With the modularity aspect, the electronics boxes can be implemented with different designs as shown in FIGS. 4A and 4B. The processor module 220 as shown in FIG. 4A includes two memory elements 310 and 312 and two processor boards 360 and 362 and the processor module 220 as shown in FIG. 4B includes one memory element 314 and one processor board 364. The number of memory elements and the number of processor boards can vary based on the requirements and/or desired performances.

In the example of the processor module as shown in FIG. 4A, two memory elements 310 and 312, network transceivers 320, a network switch 330, inductors and power regulators 340, display amplifiers 350, and processor boards 360 and 362 are provided on a processor module board, for example, a printed circuit board (PCB). The electronic components as shown in FIG. 4A is exemplary only and other implementations are also possible. In some implementations, the memory elements 310 and 312 may correspond to the SSD (Solid State Drive) modules and the processor boards 360 and 362 correspond to the SOM (System On a Module) boards. The memory elements 310 and 312 are configured to store data (e.g., media contents, user data, authentication data, etc.). The network transceivers 320 are configured to receive and transmit wireless signals and operate to assist the wireless communications with various devices inside the airplane and one or more ground servers and devices on the ground. The power regulators 340 are configured to provide stable power to the components in the electronics box 220 for optimum operation and the power amplifiers 350 are configured to respond to a small input signal and delivers a larger output signal that contains the features of the input signal. The processor boards 360 and 362 are configured to perform various processes including video decoding, audio processing, and/or graphic generations. In some implementations, the processor boards 360 and 362 may be configured to assist the payment processing routed through an LRU. Since the processor module as shown in FIG. 4B is different from the processor module as shown in FIG. 4A in terms of the number of memory elements and the processor boards, the detailed descriptions on the electronic components will be omitted.

Figure 5:
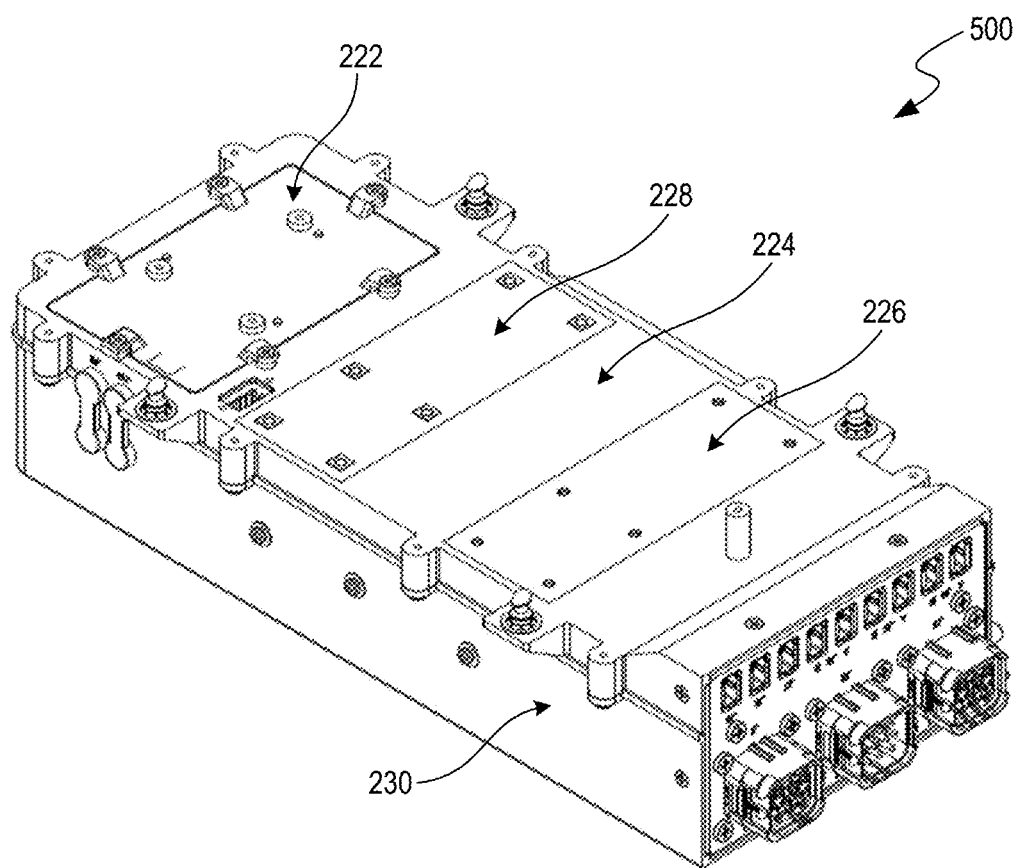
FIG. 5 shows an example view in which a processor module, a power supply module, and an input/output interface structure are assembled together based on some implementations of the disclosed technology.

FIG. 5 shows an example view in which a processor module, a power supply module, and an input/output interface structure are assembled together based on some implementations of the disclosed technology. The power supply module 230 and the processor module 220 can be assembled together by various manners. In some implementations, the processor module is attached to the power supply module 230 through mechanical connectors such as screws or engagement rings or any other interlocking mechanisms. When the processor module is assembled together with the power supply module 230, the processor module 220 and the power supply module 230 can configure a sealed structure 500 which is discussed in detail later in this patent document. Referring to FIG. 5, the processor module 220 is shown to be covered by the base frame 224 on which the memory window 222 and the receptacles 226 and 228 are provided. The receptacles 226 and 228 are provided on the base frame 224 to correspond to the locations of the heat sinks of the cooling structure. The memory window 222 corresponds to an openings that are operable between an open position and a closed position. The memory window 222 is provided at a corresponding location to a certain electronic component included in the processor module 220. Thus, when the memory window 222 is in the open positions, the corresponding electronic component can be exposed to outside and thus become accessible from outside. The transition between the open position and the closed position can be done in various manners. For example, in the example of FIG. 5, the corresponding opening is closed or opened using screws. The screws are the examples only and other implementations are also possible.

Figure 6B:
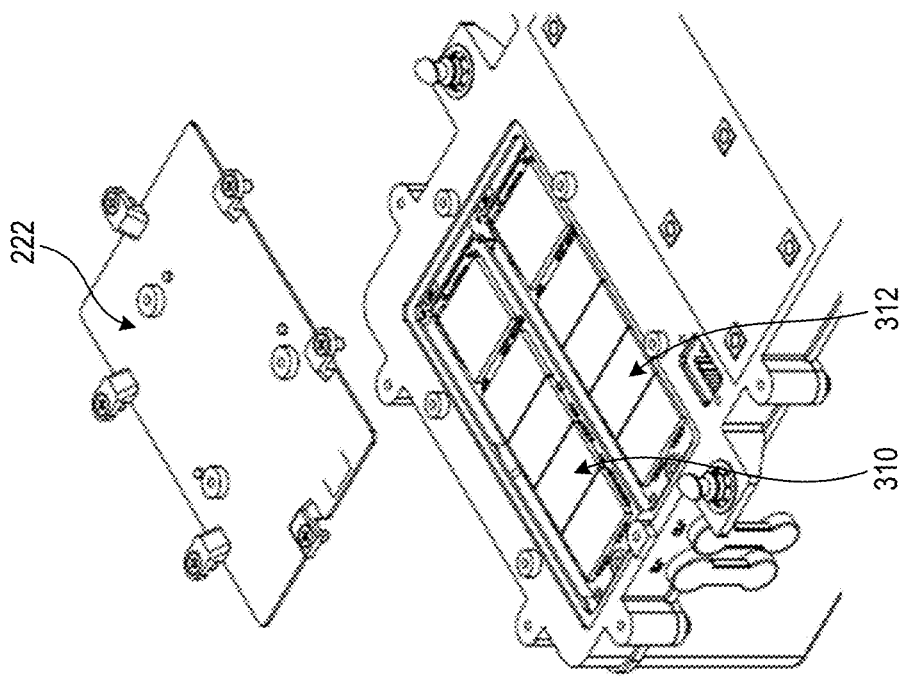
FIGS. 6A and 6B show example views of a part of a processor module when a memory window is in an open position based on some implementations of the disclosed technology.
Figure 6A:
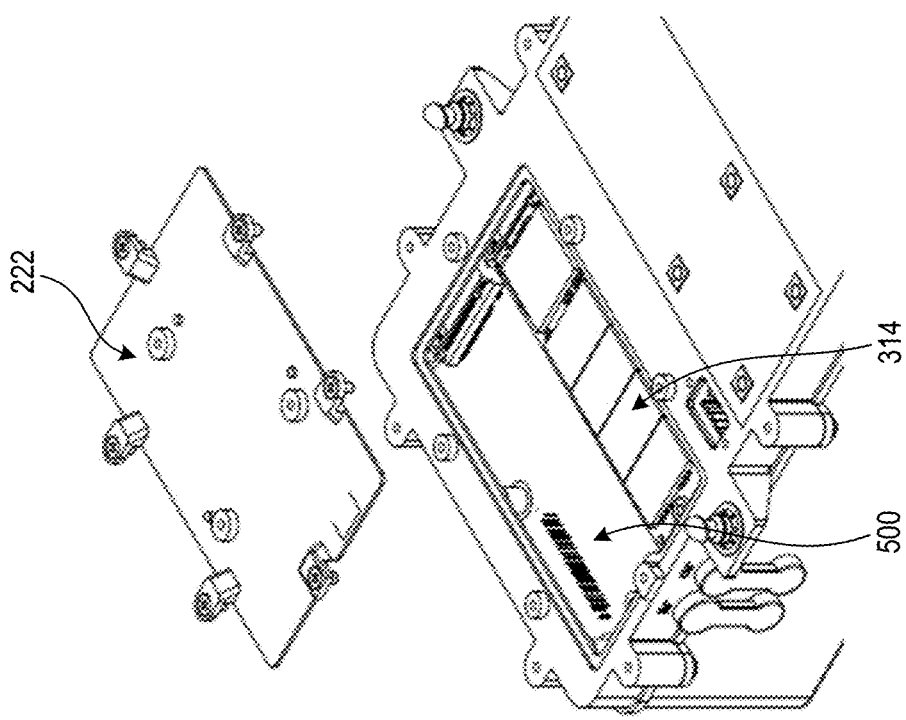

FIGS. 6A and 6B show example views of a part of a processor module when a memory window 222 is in an open position. Although the example views of FIGS. 6A and 6B show the screws as the engagement structures, other implementations are also possible. In FIG. 6A, when the memory window 222 is in the open position, the microprocessor 500 and the memory element 314 are exposed to outside and thus become accessible from outside. FIG. 6B shows the different example that when the memory window 222 is in the open position, the two memory elements 310 and 312 are exposed to outside and thus become accessible from outside. In both FIGS. 6A and 6B, the memory element 310, 312 and 314 are arranged to face outwards. With this arrangement of the memory elements 310, 312 and 314, when the memory window 222 is in the open position, the memory elements are exposed to outside without any intervening components. Thus, it is possible to easily and quickly access from outside to the memory elements of the processor module 220 from outside. The suggested design of the electronics box with the memory window 222 allows an easy access to the memory modules without having to contact or disassemble sensitive electronics, boards, and/or cables. Such easy access to the memory modules is advantageous for maintenance, repairs, or a performance check, or preloading of media, or others. For example, the disassembly of the electronics boxes which are standalone line replaceable units (LRU) is regularly required to maintain proper ESD (Electrostatic discharge) practices and thus the easy access can make it easier to perform such maintenance. In addition, the preloading of media can reduce time of initial movie deliverables in the case of the new plane delivery.

In some implementations, the receptacles 226 and 228 can operate as access points for some electronic components, e.g., the processor boards (e.g., SOM boards). As discussed with regard to the memory window 222, the receptacles 226 and 228 can allow an easy access to the corresponding electronic components (e.g., SOM boards). Although FIG. 5 shows the memory window 222 and the receptacles 226 and 228 are provided on the base frame 224 of the processor module, other implementations are also possible. For example, any of the receptacles 226 and 228 and the memory window 222 can be omitted and the number of receptacles 226 and 228 and the number of the memory windows 222 can be changed. In some implementations, the number of memory windows 222 and the number of receptacles 226 and 228 can be determined based on which electronic components need the most frequent accesses and/or how many heat sinks are disposed in the cooling structure of the electronics box.

Figure 7:
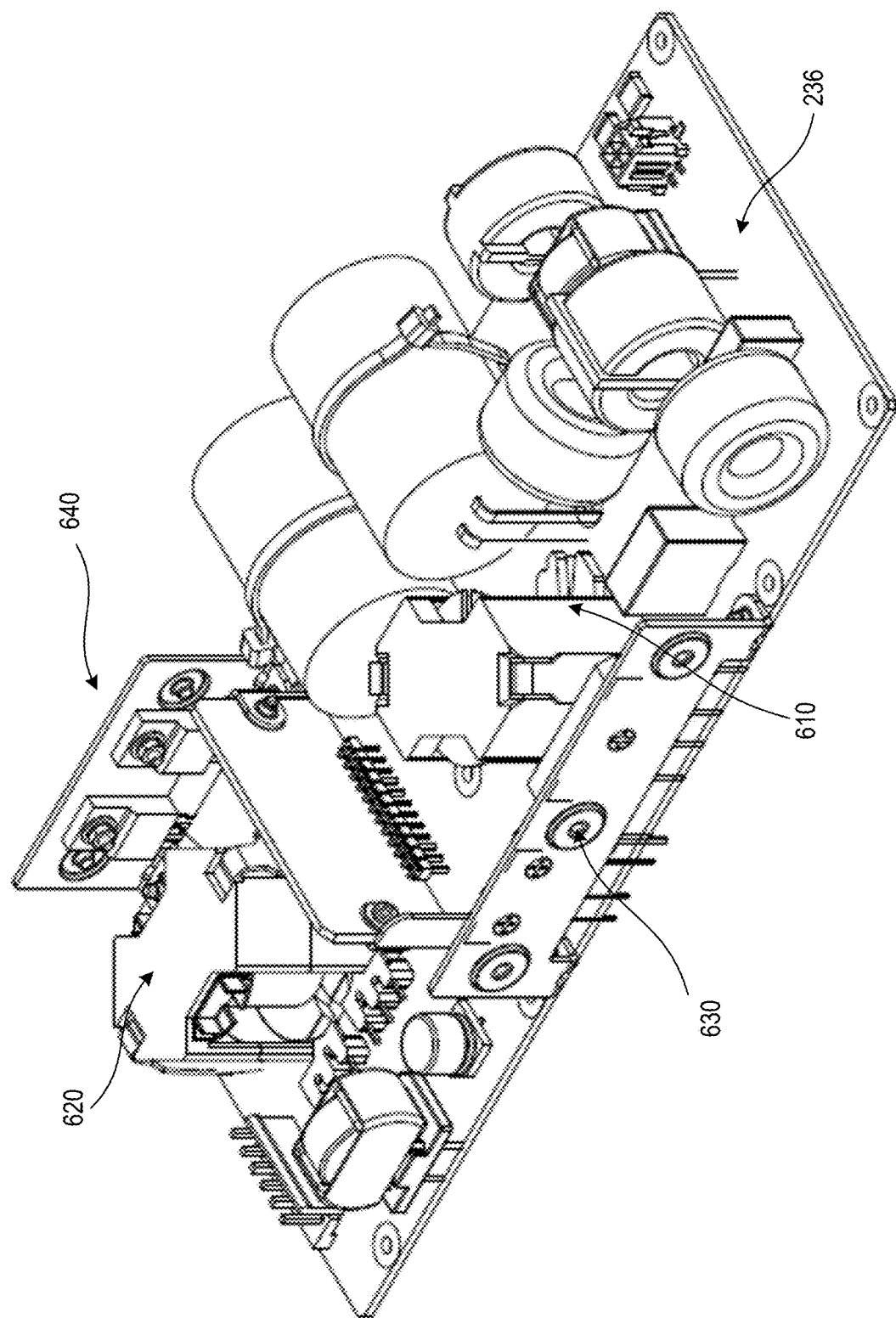
FIG. 7 shows an example view of a power supply module of an electronics box based on some implementations of the disclosed technology.

FIG. 7 shows an example view of a power supply module of an electronics box based on some implementations of the disclosed technology. In the example, the power supply module includes power supply components disposed on the power supply board 236 (e.g., PCB). The power supply components are accommodated in the power supply module housing (not shown in FIG. 7) and the components of the power supply module are thermally connected to the power supply module housing. For example, the inductor 610 is configured to store power and is connected thermally to the bottom surface 600 of the power supply board. The transformer 620 is configured to perform a voltage conversion operation and is connected thermally to the bottom surface of the power supply module housing. The rectifier 630 operates as an AC to DC converter and is connected thermally to the sidewall of the power supply module housing. The transistors, for example, GaN FETS (gallium nitride field-effect transistors) 640, which operate as a switching element, can be disposed to be connected thermally to the sidewall of the power supply module housing. In some examples, MOSFETs (metal-oxide-semiconductor field-effect transistors) can be also disposed to be thermally connected to the sidewall of the power supply module. The power supply components shown in FIG. 7 are the example only and other implementations are also possible. For example, the power supply components included in the power supply module can be modified based on the design requirements and/or power regulations.

Cooling Structure of Electronics Box

Implementations of the disclosed technology provide a new approach to cool electronic components included in the electronics box. In the conventional electronics box, one or more fans are disposed to provide air to circulate around the power supply components and processor boards such that air from the one or more fans directly cools the heat generated by the electronic components. To introduce air directly to the electronic components, the electronics box usually has one or more openings through which air enters into the electronics box. This cooling mechanism with the openings on the electronics box, however, allows not only air but also undesired substances, such as dusts, hair, moisture, etc. to be introduced into the electronics box. According to the disclosed technology, the processor module and the power supply module are configured as two distinctive elements using two separate main boards and provide a sealed structure when assembled together as shown in FIG. 5. The sealed structure does not have any openings since any fans are not disposed inside of the sealed structure, which eliminates turbulent airflow and prevents the dust and liquid intrusion to the electronic components included in the sealed structure.

Figure 8:
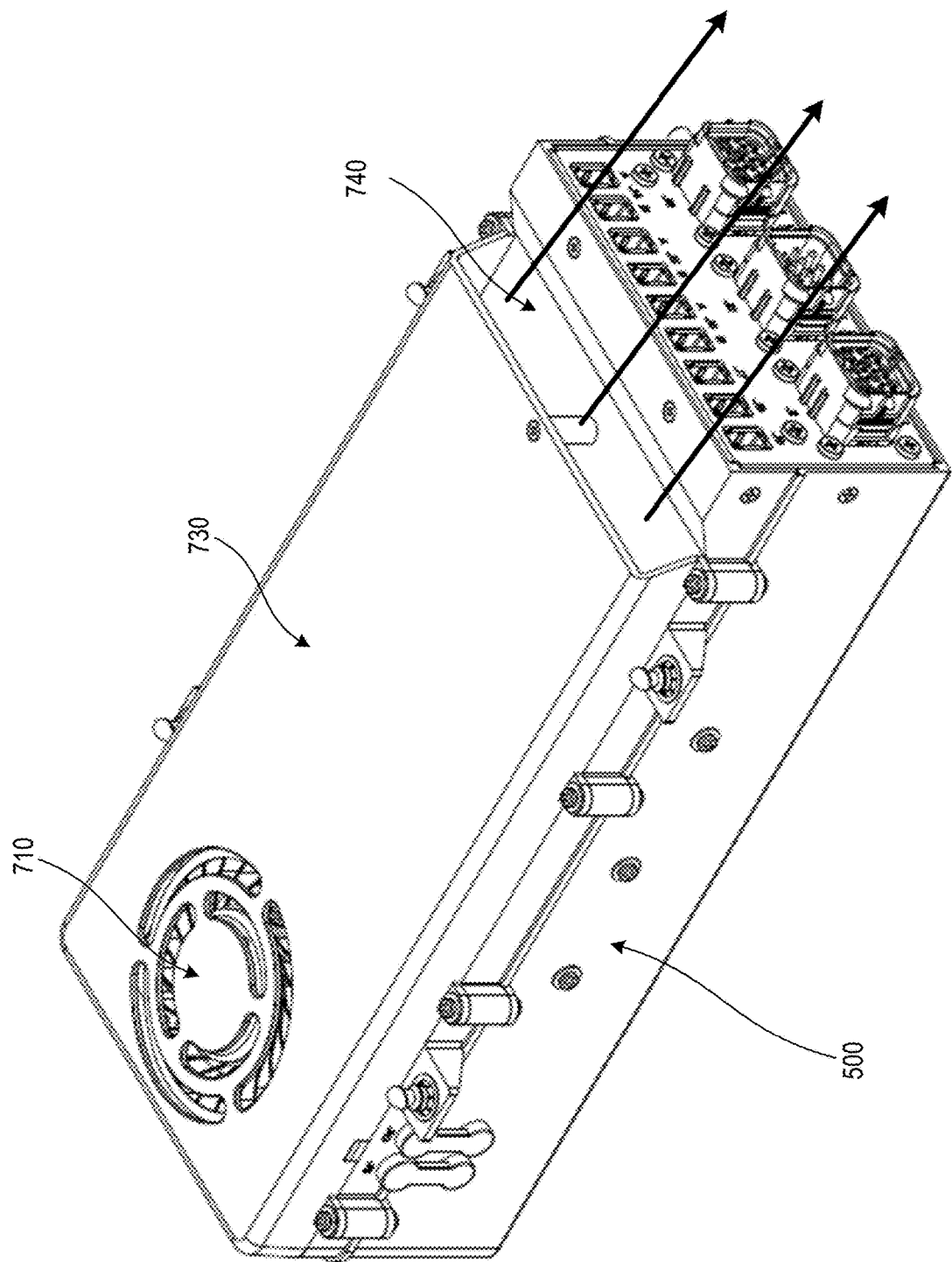
FIG. 8 shows an example view of an electronics box in which a cooling structure including a duct cover is assembled together with a sealed structure based on some implementations of the disclosed technology.
Figure 10:
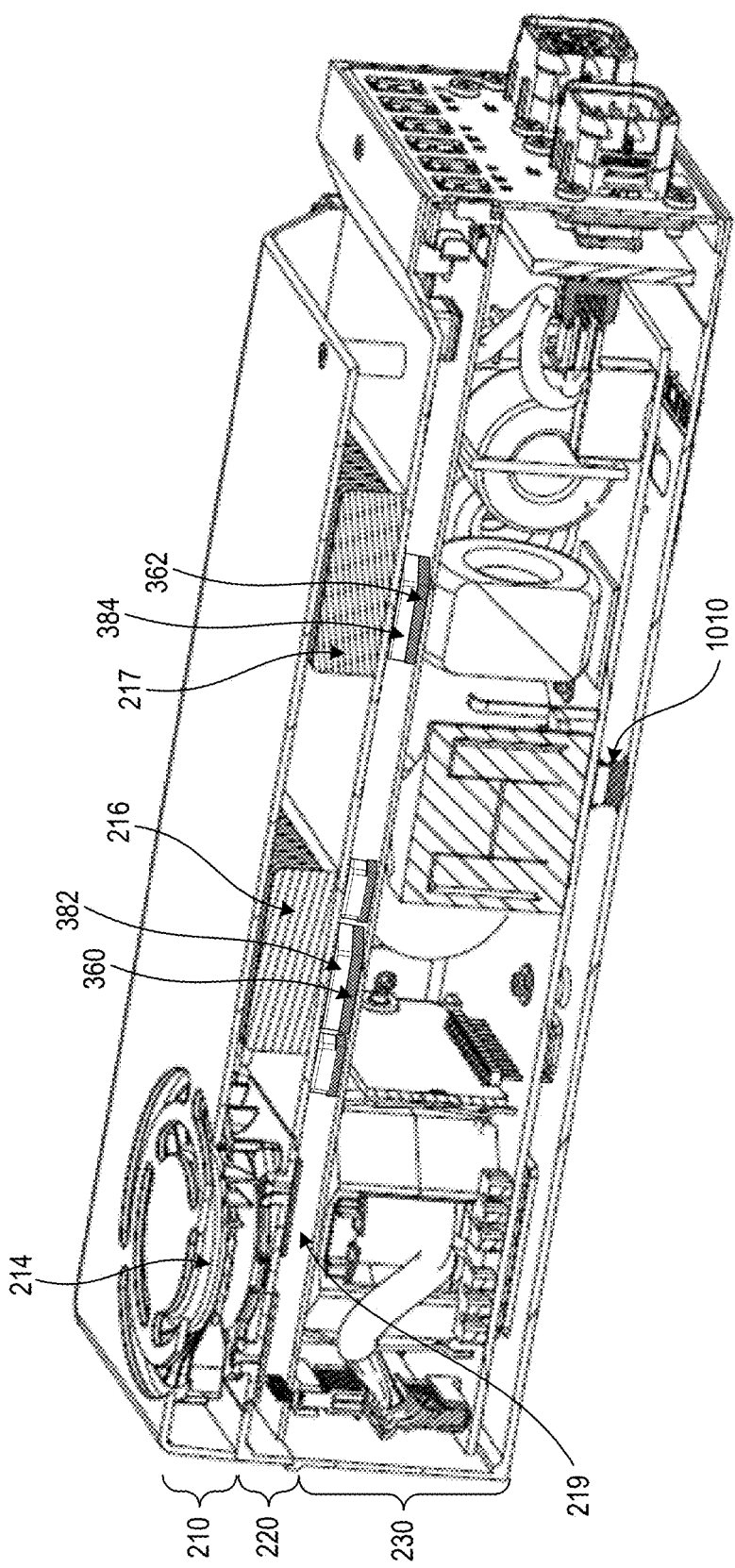
FIG. 10 shows an example side view of an electronics box including a power supply module, a processor module and a cooling structure based on some implementations of the disclosed technology.
Figure 11B:
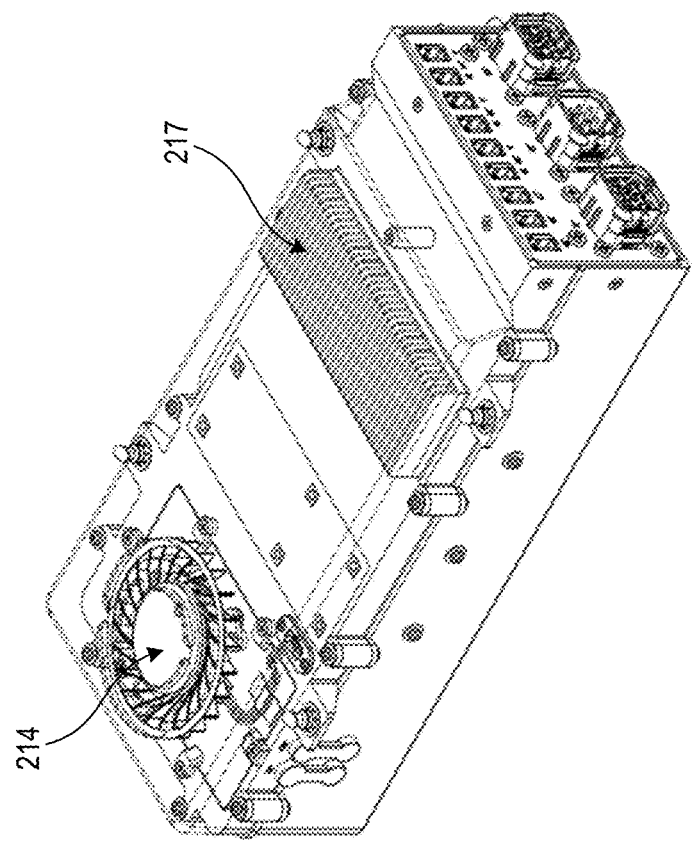
FIGS. 11A and 11B show examples of an electronics box with different heat sink configurations based on some implementations of the disclosed technology.

FIG. 8 shows an example view of an electronics box in which a cooling structure including a duct cover is assembled together with a sealed structure including a processor module and a power supply module. The cooling structure is implemented as a separate structure from the sealed structure 500 and includes an air inlet 710, an air outlet 740, a duct cover 730, a fan 214, and a heat sink 216 (fan 214 and heatsink 216 are shown in FIGS. 10-11B). The duct cover 730, which can be referred to as the plenum cover, is configured to facilitate air circulation for air by providing pathways for airflows. The duct cover 730 (plenum cover) can operate as a housing for the cooling structure that accommodates the fan 214 and the heat sink 216 and is configured to force air to flow through the air passage using pressure differences inside the cooling structure, e.g., from a region at high pressure around the air inlet 710 to a region at low pressure around the air outlet 740.

Figure 9:
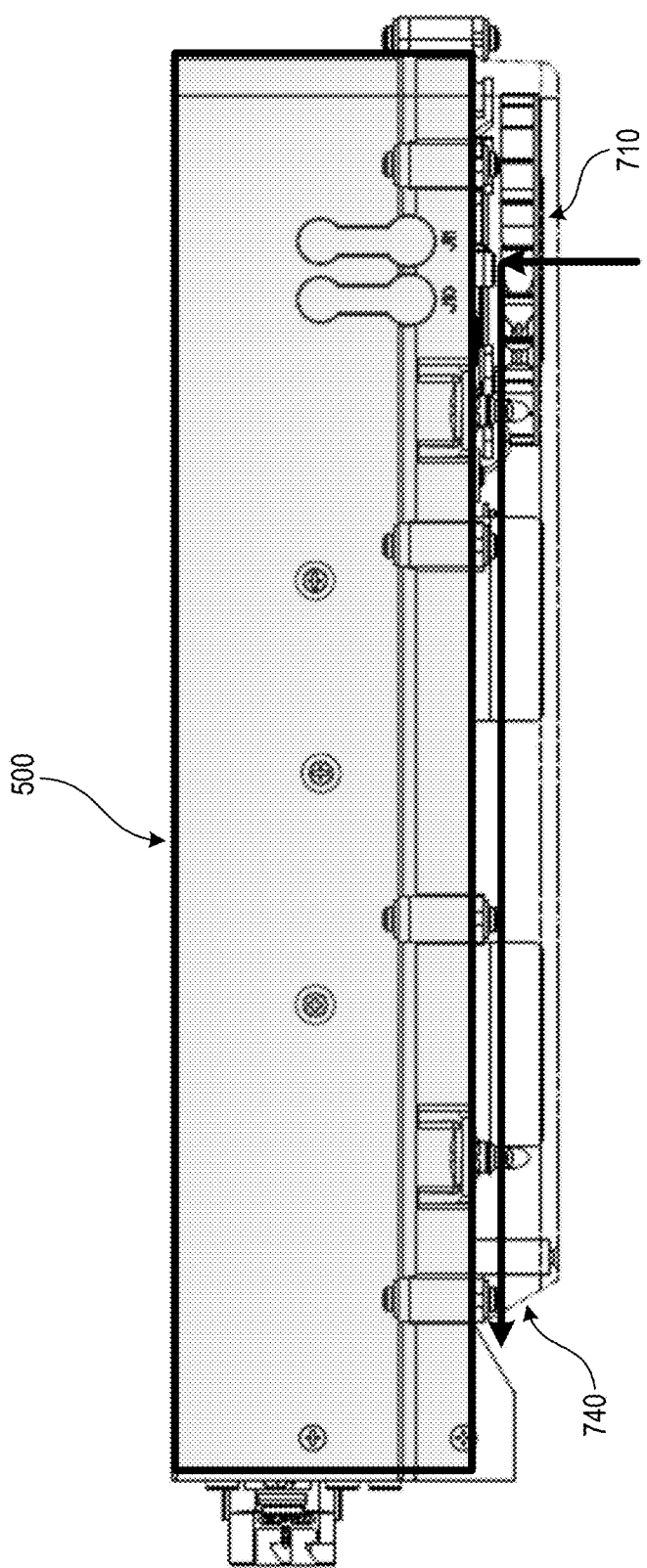
FIG. 9 shows an example view showing an air flow passage through a cooling structure of an electronics box based on some implementations of the disclosed technology.

FIG. 9 shows an example view showing an air passage flowing through a cooling structure of an electronics box based on some implementations of the disclosed technology. The air is introduced by the fan 214 through the air inlet 710 from outside and flows along the internal space of the cooling structure, which creates a cooling tunnel. The arrows as shown in FIG. 9 indicate the air passage and the passage of the air along the cooling structure may be referred to as the cooling tunnel. In the implementation as shown in FIGS. 8 and 9, the duct cover covers the top, one side of the cooling structure (left side in FIG. 8 and the right side in FIG. 9) is closed, and the sealed structure 500 does not provide any passage for the air entering to the sealed structure. Thus, the air moves along the cooling tunnel and then comes out from the air outlet 740. The suggested cooling structure allows the ability to maintain a 65 W sealed electronics box. In some implementations, the direction of the air traveling along the cooling tunnel can affect the placement of the arrangements of the electronic components of the sealed structure.

In the implementations, the cooling tunnel is located outside of the sealed structure 500 and external to the sealed structure 500 where the electronic components generating heat are included. To make the cooling tunnel of the cooling structure effectively cool the heat generated by the electronic components included in the sealed structure 500, the heat generated by the electronic components need to be collected and transferred to the cooling structure. The implementations of the disclosed technology provide thermally conductive structures 382 and 384 through which heat is collected and transferred from the electronic components of the processor module 220 and the power supply module 230 of the sealed structure to the cooling structure 210.

FIG. 10 shows an example side view of an electronics box including a power supply module, a processor module, and a cooling structure based on some implementations of the disclosed technology. Referring to FIG. 10, the thermally conductive structures 382 and 384 are provided in the electronics box to provide thermal conduction paths between the electronic components and the heat sink 216 and 217 of the cooling structure 210. For example, the electronic components 360 and 362 of the processor module 220 are in thermal contact with the heat sinks 216 and 217 through the thermally conductive structures 382 and 384 and also the base frame of the processor module 220. The thermal contact can refer to an interface of two materials through which heat moves. Thus, the heat generated by the electronic components of the processor module 220 is transferred to the heat sinks 216 and 217 through the thermally conductive structures 382 and 384 and then the heat can be cooled by the heat dissipation of the heat sinks 216 and 217. In some implementations, the thermally conductive structure 382 and 384 may be configured as bosses from the processor module board and have a height that allows the thermal connection between the corresponding electronic components of the processor module and cooling components (e.g., the heat sinks 216 and 217) of the cooling structure. The base frame also includes thermally conductive material such as metal. Although FIG. 10 shows that the thermally conductive structures 382 and 384 are disposed between the electronic components 360 and 362 and the heat sinks 216 and 217, other implementations are possible as long as the thermal conductive path can be formed between the electronic components 360 and 362 and the heat sinks 216 and 217. For example, the thermally conductive structures 382 and 384 may be disposed under the electronic components 360 and 362 and then the thermally conductive path between the electronic components 360 and 362 and the heat sinks 216 and 217 can be formed through the base frame. In some implementations, the thermally conductive structure includes materials such as elastomeric pads, adhesive tapes, greases, or others. In the implementations, various components of the processor module 220 are in contact with the base frame through the thermally conductive structures 382 and 384 and thus heat can be transferred through the base frame to the heat sinks 216 and 217 and then actively cooled by the fan.

In some implementations, the thermal conductive paths are also provided between the electronic components of the power supply module 230 and the heat sinks 216 and 217. For example, the power supply module housing for accommodating the power supply module 230 includes thermal conductive materials and the electronic components of the power supply module can be in thermal contact with the power supply module housing through thermal interface materials. For example, the transformer, MOSFETs, rectifiers, inductor, and GaN FETS are thermally connected to the power supply module housing (e.g., bottom wall or side walls), and thus the heat generated by those components of the power supply module can be dissipated outside of the power supply module 230. In some implementations, the thermally conductive interfaces 1010 are also provided on the bottom surface of the power supply module housing such that heat is dissipated from the corresponding components of the power supply module 230 to outside through the power supply module housing which has a threshold sufficient to stay cool even with the heat dissipation therethrough. Various components of the power supply module 230 are in contact with the power supply module housing (power chassis) through the thermal conductive materials/thermally conductive interfaces 1010, and thus heat can be transferred through thermal conductive materials/thermally conductive interfaces 1010 and then actively cooled by the fan.

In the example as shown in FIG. 10, the heat sinks 216 and 217 are provided at locations corresponding to the processor boards 360 and 362. In this case, the heat sinks 216 and 217 include the thermally conductive material and thus are in thermal contact with the processor boards 360 and 362 through the thermally conductive structures 382 and 384. Although FIG. 10 shows the processor boards 360 and 362 being in thermal contact with the heat sinks 216 and 217, other implementations are also possible without being limited to the processor boards. The placement of the electronic components of the processor module 220 can be determined based on at least one of a number of heat sinks provided in the cooling structure 230, a direction of the air passage, heat generating characteristics of the electronic components, etc. For example, since air gets heated as it travels through the cooling tunnel and passes the heat sinks 216 and 217, the heat sink 216, which is relatively closer to the inlet, can have a stronger capability to cool the heat as compared to the heat sink 218 which is relatively closer to the outlet. In the example, in this case, the electronic component which generates more heat and is more sensitive to heat can be located at a corresponding location to the heat sink 216 to be in thermal contact with the heat sink 216 and the electronic component which generates less heat and is less sensitive to heat can be located at a corresponding location to the heat sink 217 to be in the thermal contact with the heat sink 218. Such placements of the electronic components, however, are examples only and other implementations are also possible.

In addition, the heat sinks 216 and 217 are the examples only and other implementations are also possible as long as a corresponding structure can operate to dissipate heat. Each of the heat sinks 216 and 218 is structured to have multiple fins through which air passes to dissipate the heat. Each fin extends along a same direction as the direction that the air travels such that the fin does not block the air flow. Various designs can be made to the fins of the heat sinks 216 and 217 to provide laminar air flow to more efficiently cool the heat transferred to the cooling structure.

Figure 11A:
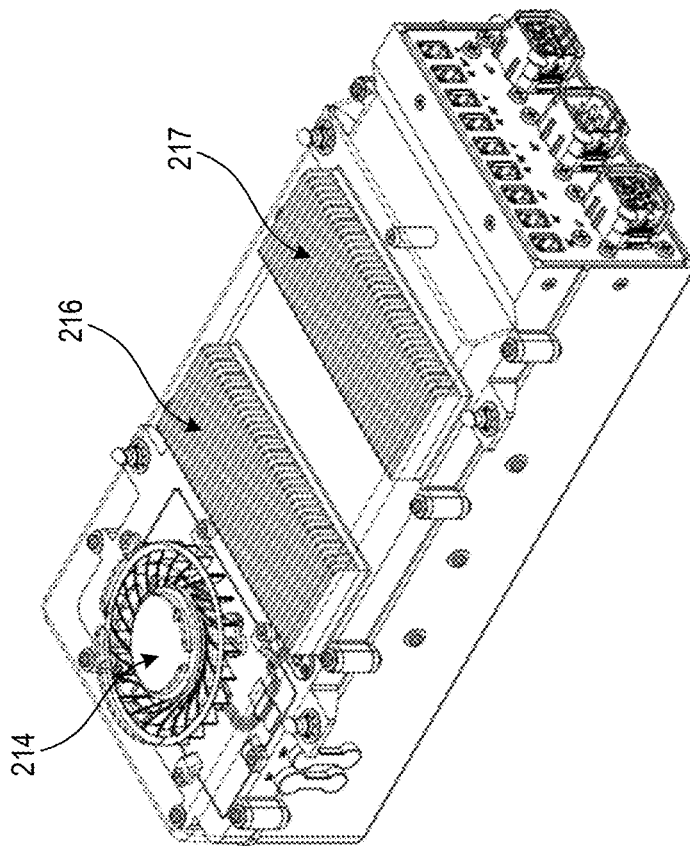

FIGS. 11A and 11B show examples of an electronics box with different heat sink configurations based on some implementations of the disclosed technology. In the example views as shown in FIGS. 11A and 11B, the duct cover is shown as the dotted lines to expose the internal components of the cooling structure (i.e., the fan 214 and the heat sinks 216 and 217). In the implementations of the disclosed technology, the heat sinks 216 and 217 are provided as a modular and configurable structure, which corresponds to an array of fins. FIG. 11A shows the cooling structure with two arrays of the heat sinks 216 and 217 and FIG. 11B shows the cooling structure with the single array of the heat sink 216. Although two examples of the dual array and the single array of heat sink configurations are shown in FIGS. 11A and 11B, other implementations are also possible. The number of arrays of the heat sinks may be determined based on the number of processor boards, required cooling performances, etc.

Although FIG. 11A shows that the two arrays of the heat sinks 216 and 217 have similar configurations, other implementations are also possible. For example, the number of fins included in each array can be different from each other. In some implementations, the heat sink 216 is greater than the heat sink 217 and vice versa. In some implementations, the heat sink 216 can have a greater number of fins than that of the heat sink 217 and vice versa. In some implementations, the size of fins included in each array can be different from each other. When there are multiple heat sink arrays in the cooling structure, the configurations of the heat sinks and the arrangements of the electronic components corresponding to the heat sinks can be determined based on the relative position of the corresponding heat sink to the fan 214. For example, in FIG. 11A, the heat sink 216 is relatively closer to the fan 214 and the heat sink 217 is relatively far from the fan 214. The air entering the heat sink 216 has relatively lower temperature as compared to the air entering to the heat sink 217 since the heat dissipation occurs as the air passes through the heat sink 216. Various implementations can be made to increase the operation balance, the cooling efficiency, etc., of the multiple heat sinks. In some implementations, among the electronic components included in the processor module, the first group of electronic components which generate relatively more heat and are more sensitive to the temperature can be arranged to be in thermal contact with the heat sink 216 which is closer to the fan 214, and the second group of electronic components which generate relatively less heat and are less sensitive to the temperature can be arranged to be in thermal contact with the heat sink 217 which is further from the fan 214.

Figure 12:
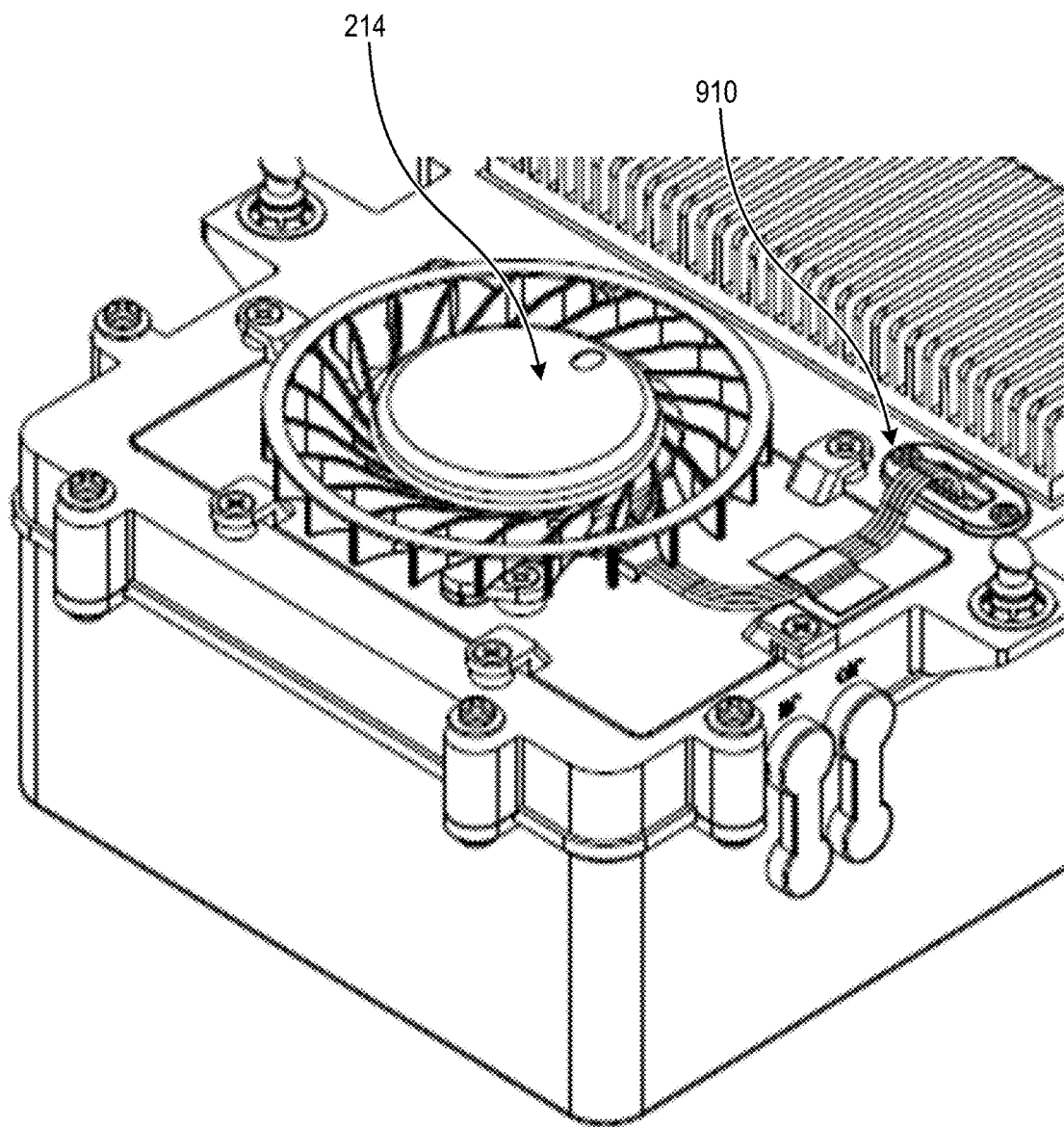
FIG. 12 shows an example of a connector of a fan based on some implementations of the disclosed technology.

FIG. 12 shows an example of a connector of a fan based on some implementations of the disclosed technology. As shown in FIG. 12, the fan 214 has a connector 910 that is accessible when the duct cover is removed or open. Thus, the fan can be easily replaced when needed without even opening the sealed structure. In some implementations, there is a quick-start option for the fan to self-clean any dust that is somewhat loose on the fan or heat sink(s).

According to various implementations of the disclosed technology, the electronics box with modularity and accessibility can be provided, which were not available in the prior art. Also, the electronics box allows for the electronic components to be included in the sealed structure which is completely protected from the external contamination, such as dusts, liquid, etc. With the sealed structure, there is no need for additional treatments, such as coating the electronics box to protect the electronic components of the electronics box from the liquid intrusion and/or other contaminants. In addition, the cooling structure of the electronics box is provided to be disposed outside of the sealed structure to cool the heat transferred from the electronic components included in the sealed structure to the cooling structure. Since the cooling of the heat proceeding through the air tunnel is created within the cooling structure, the electronics box can be installed without requiring any extra clearance for the air circulation. This actually reduces the installation space needed for the electronics box. Due to the space limitation inside the commercial passenger vehicle, reducing the installation space for the electronics box can improve passenger experience by providing more space to each passenger. In addition, the reduction of the required space for the installation of the electronics box can provide more flexibility in terms of the installation locations for the electronics boxes.

Figure 13A:
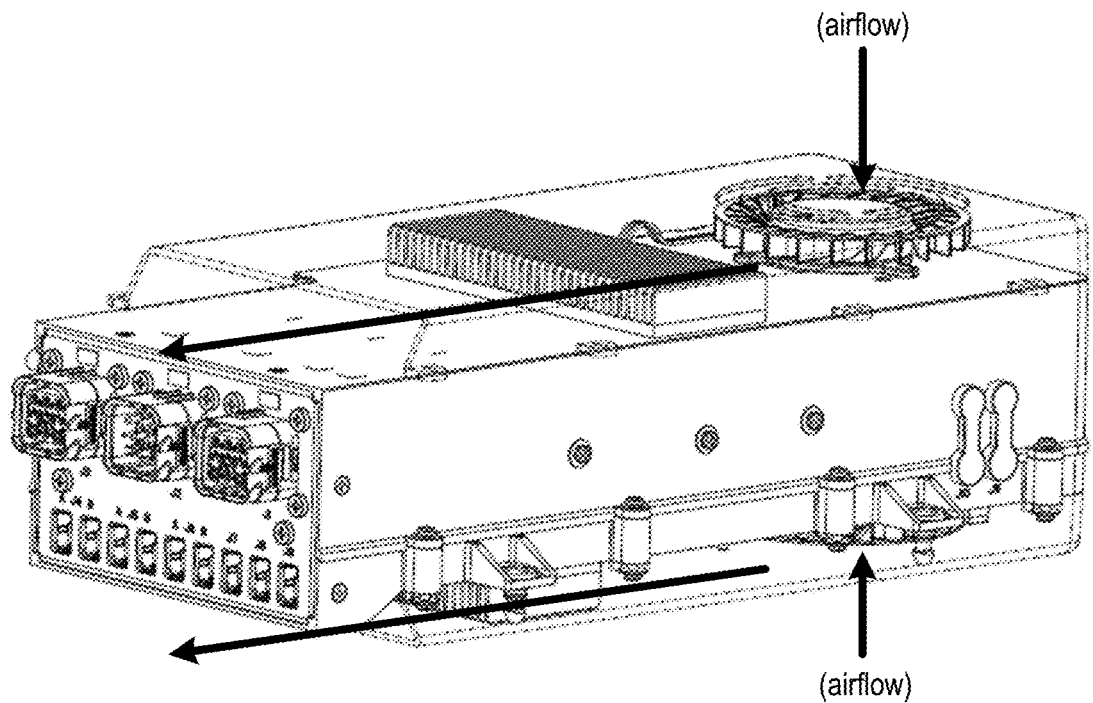
FIGS. 13A and 13B show different views of an examples of an electronics box based on some implementations of the disclosed technology.
Figure 13B:
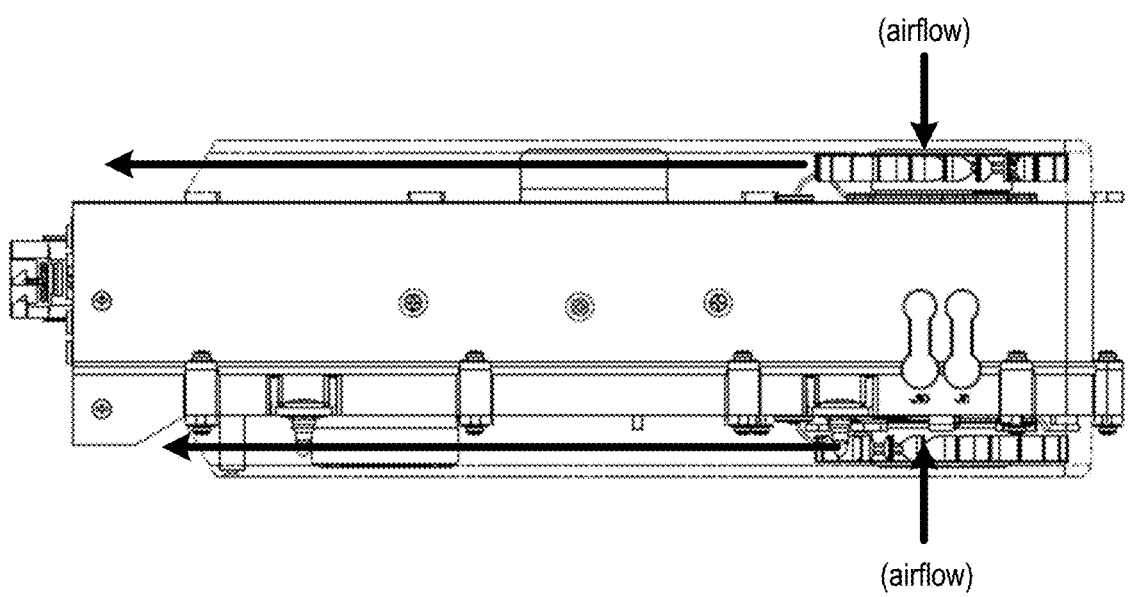

Various implementations of the electronics box can be made by changing the location of the cooling structure or adding more fans and heatsinks to the electronics box. In the implementations, the elements of the cooling structure, the fan, heat sink, and duct cover, are scalable and can be added to various locations of the electronics box to meet various cooling requirements. FIGS. 13A and 13B show different views of an examples of an electronics box based on some implementations of the disclosed technology. In FIGS. 13A and 13B, the cooling structures are provided on top and bottom surfaces of the sealed structure. In FIGS. 13A and 13B, the duct covers are shown as a dotted line to show the internal components (e.g., the fans and the heat sinks) of the cooling structures. Although the additional cooling structure is also disposed on the bottom surface of the power supply module housing, the remaining structures are similar to those discussed above. The arrows indicate the air passages from the air inlets to the air outlets. By creating the cooling tunnels on both sides of the sealed structure, the cooling of the heat can be faster and more efficient.

Figure 14:
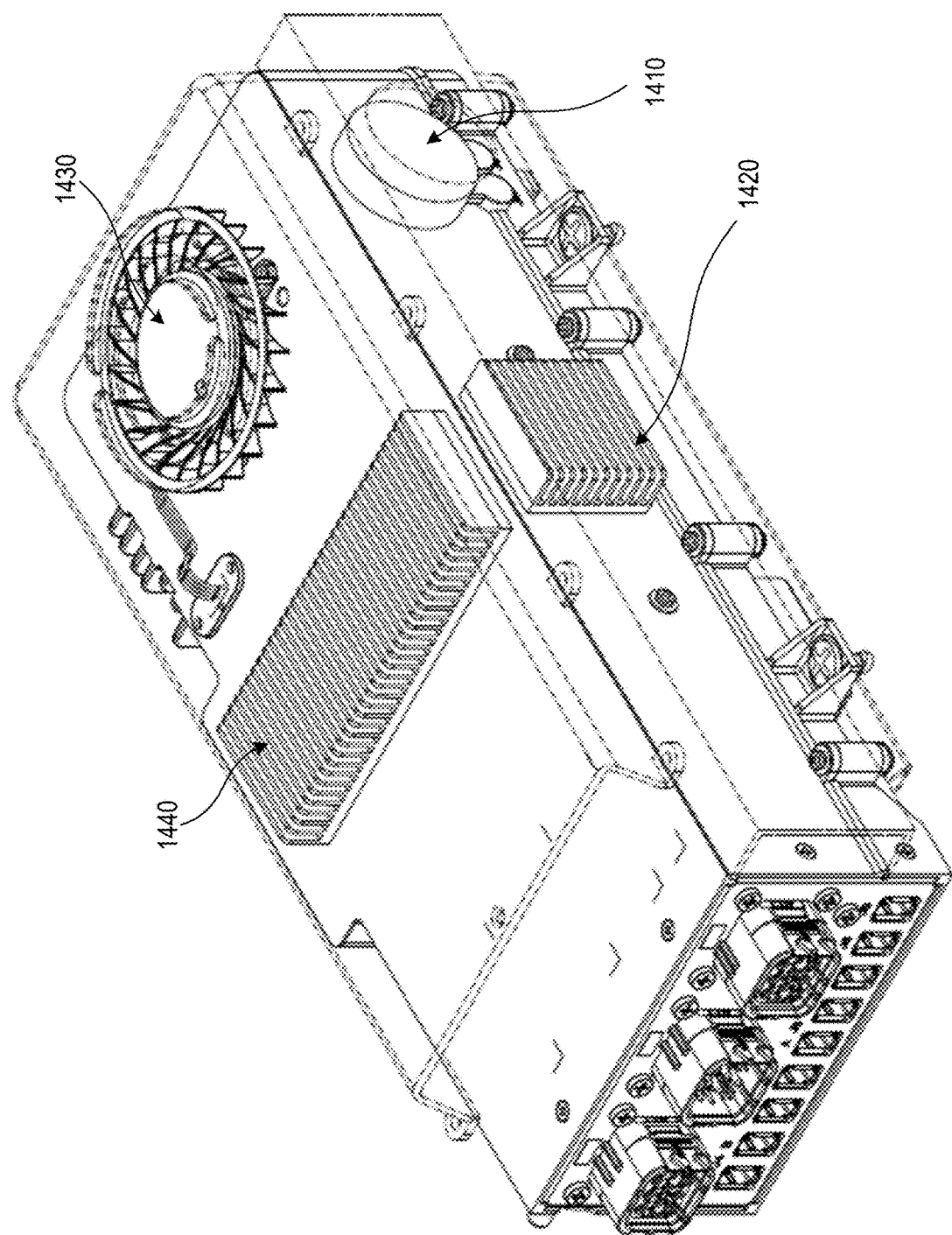
FIG. 14 shows another example of an electronics box based on some implementations of the disclosed technology.

FIG. 14 shows another example of an electronics box based on some implementations of the disclosed technology. In FIG. 14, the cooling structures are provided on the side surface and the bottom surface of the sealed structure. The fan 1410 and the heat sink 1420 are disposed on the side surface of the sealed structure and the fan 1430 and the heat sink 1440 are disposed on the bottom surface of the sealed structure. In FIG. 14, the duct covers are shown as a dotted line to show the internal components (e.g., fan and heat sinks) of the cooling structures. Various implementations can be provided by providing the cooling structure on the selected surfaces of the sealed structure among the bottom, top, and side surfaces of the sealed structure. Although FIG. 14 shows the implementations that the cooling structures are provided on the side surface and the bottom surface of the sealed structure, the cooling structures can be added to all side surfaces of the sealed structure. As discussed above, since the cooling structure is implemented with the fan, the duct cover, and the heat sinks, which are scalable, adding the cooling structure to the selected surface of the sealed structure can be implemented in various manner to meet cooling requirements and other needs.

Figure 15A:
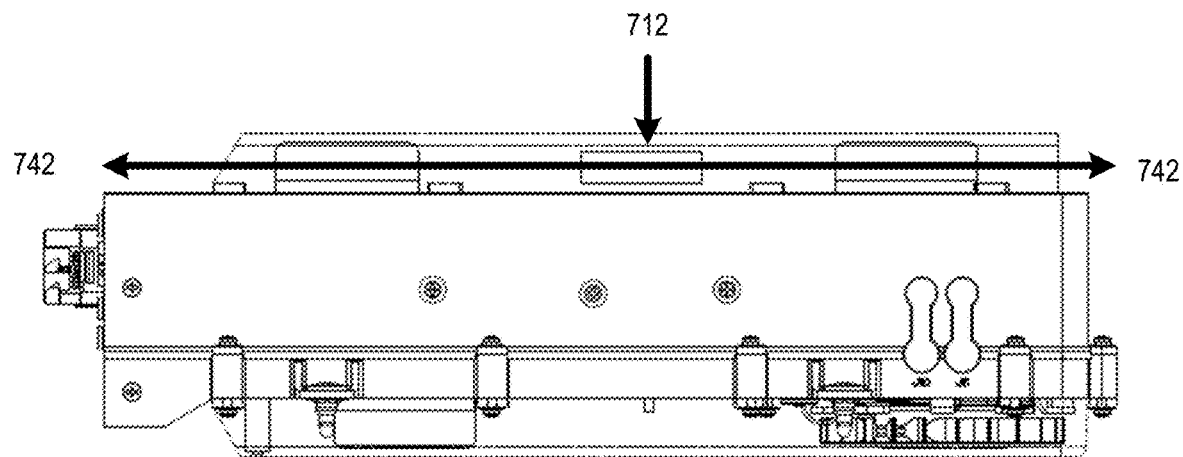
FIGS. 15A and 15B show different views of another example of an electronics box based on some implementations of the disclosed technology.
Figure 15B:
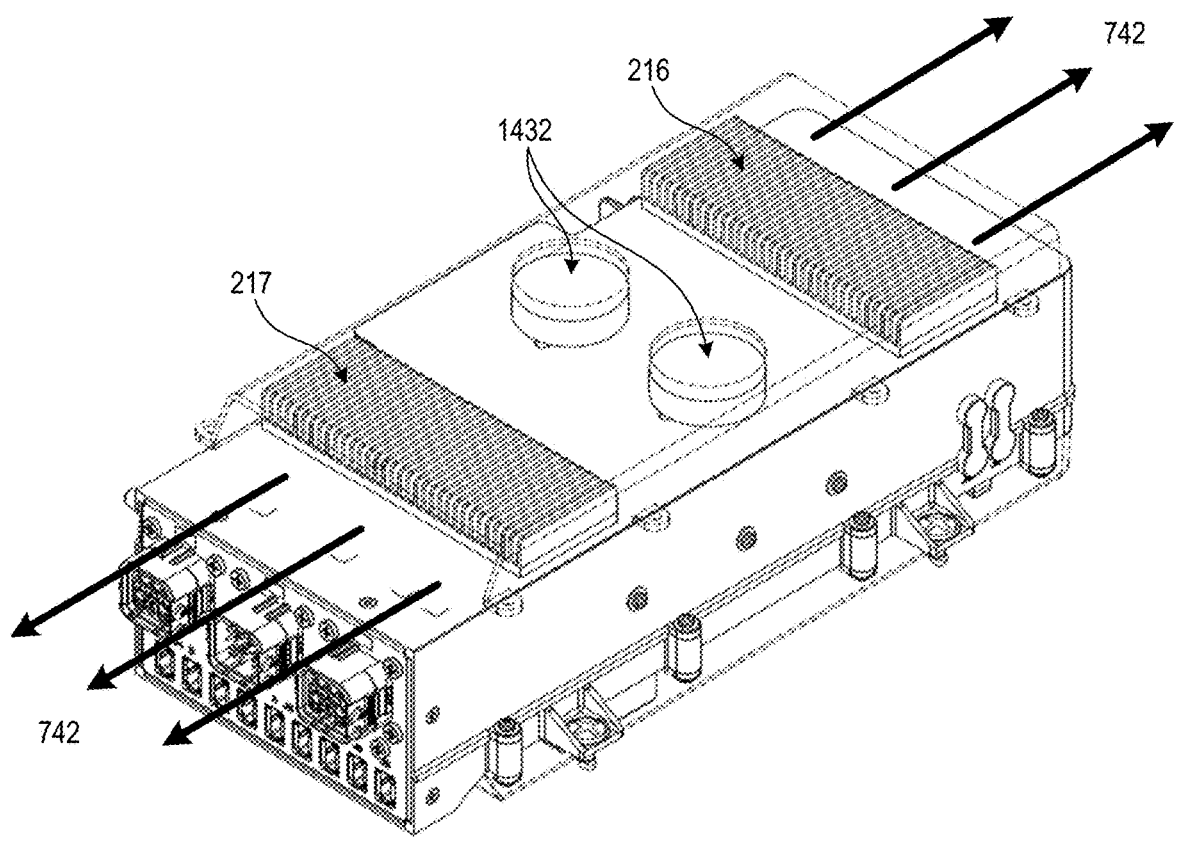

FIGS. 15A and 15B show different views of another example of an electronics box based on some implementations of the disclosed technology. In FIGS. 15A and 15B, the duct covers are shown as the dotted line to show the internal components (e.g., fan and heat sinks) of the cooling structures. In FIGS. 15A and 15B, two fans 1432 are disposed on a middle portion of the cooling structure and the heat sinks 216 and 217 are disposed on both sides of the fans 1432. Although the two fans 1432 and the two heat sinks 216 are shown, the number of fans and heat sinks can be modified. In FIGS. 15A and 15B, the air enters through the air inlet 712 that is located at the middle portion of the cooling structure to correspond to the location of the fans 1432, and the air travels towards to the air outlets 742 that are located at both ends of the cooling structure.

Figure 16:
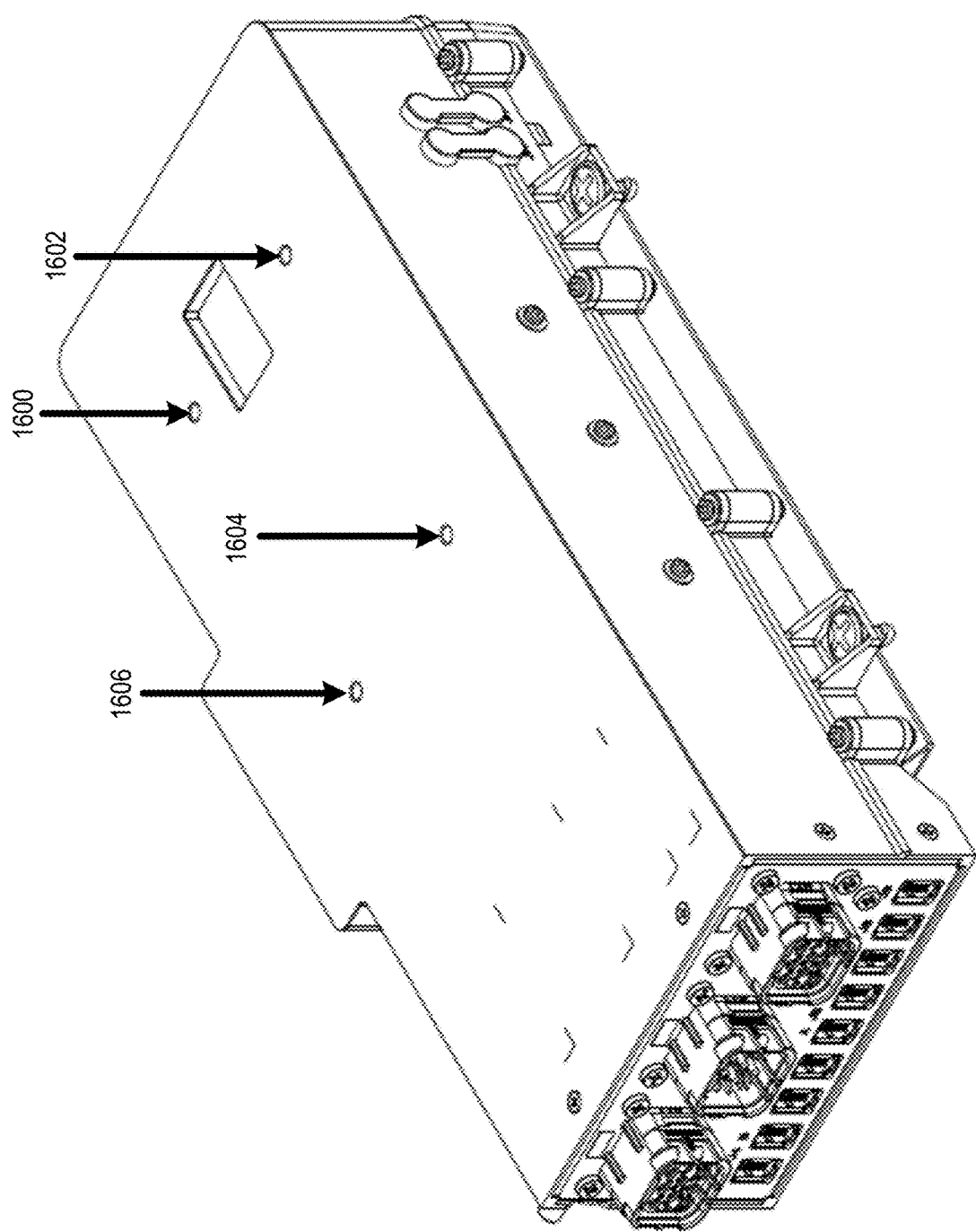
FIG. 16 shows another example of an electronics box based on some implementations of the disclosed technology.

FIG. 16 shows another example of an electronics box based on some implementations of the disclosed technology. The electronics box has threaded mount locations 1602, 1604, 1606, 1608 on the duct cover of the electronics box. The electronics box is a standalone units for cooling. In certain circumstances, an additional heat dissipation can be achieved when interfaced with surrounding structures such as the seat frame. However, when this occurs there is no assurance that there will be sufficient contact between the electronics box and the surrounding structure to dissipate heat. The threaded mount locations 1602, 1604, 1606, 1608 adds the dedicated mounting locations for heat transfer to achieve maximum thermal efficiency.

Figure 17:
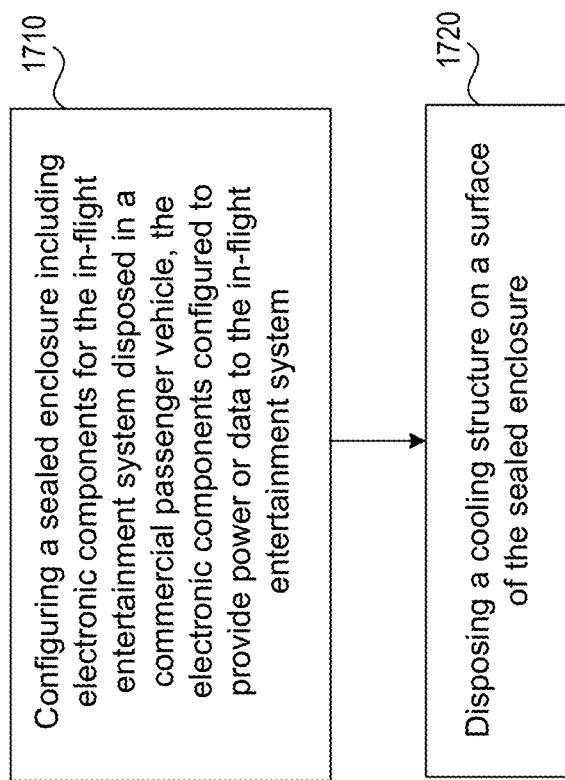
FIGS. 17 and 18 show example flowcharts of a method for providing an electronics box disposed on a commercial passenger vehicle based on some implementations of the disclosed technology.

FIG. 17 is an example flowchart of a method for providing an electronics box for an in-flight entertainment system. The method 1700 includes, at an operation 1710, configuring a sealed enclosure including electronic components for the in-flight entertainment system disposed in a commercial passenger vehicle. The electronic components are configured to provide power or data to the in-flight entertainment system. The method 1700 further includes, at an operation 1720, disposing a cooling structure on a surface of the sealed enclosure. The cooling structure includes: a fan introducing air from outside into the cooling structure, the air creating an air passage that is external to the sealed enclosure and extending along the surface of the sealed enclosure; one or more heat dissipation elements disposed in the air passage and configured to dissipate heat generated by the electronic components; and a duct cover covering the fan and the one or more heat dissipation elements and having an air inlet through which the air enters into the cooling structure.

Figure 18:
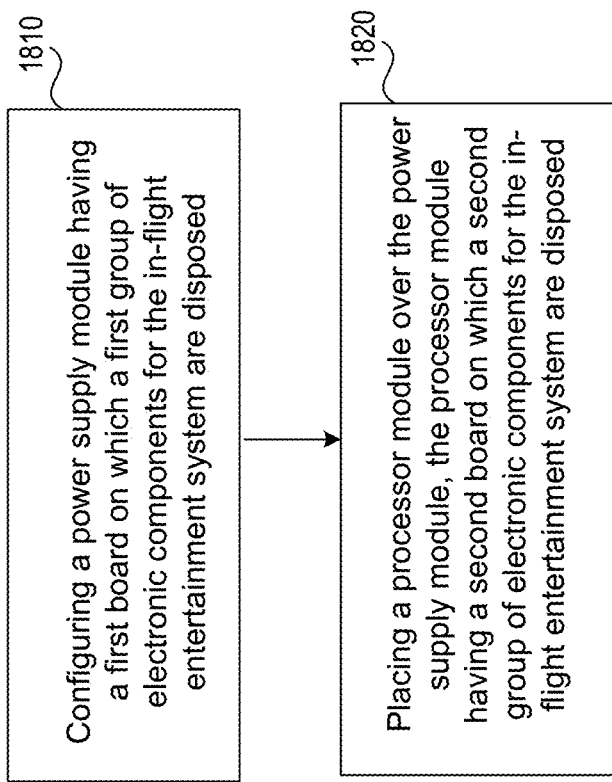

FIG. 18 is an example flowchart of a method for providing an electronics box for an in-flight entertainment system. The method 1800 includes, at an operation 1810, configuring a power supply module having a first board on which a first group of electronic components for the in-flight entertainment system are disposed. The method 1800 further includes, at an operation 1820, placing a processor module over the power supply module, the processor module having a second board on which a second group of electronic components for the in-flight entertainment system are disposed. The first group of electronic components and the second group of electronic components are configured to provide power or data to the in-flight entertainment system that is located in the commercial passenger vehicle.

Some of the embodiments described herein are described in the general context of methods or processes, which may be implemented in one embodiment by a computer program product, embodied in a computer-readable medium, including computer-executable instructions, such as program code, executed by computers in networked environments. A computer-readable medium may include removable and non-removable storage devices including, but not limited to, Read Only Memory (ROM), Random Access Memory (RAM), compact discs (CDs), digital versatile discs (DVD), etc. Therefore, the computer-readable media can include a non-transitory storage media. Generally, program modules may include routines, programs, objects, components, data structures, etc. that perform particular tasks or implement particular abstract data types. Computer- or processor-executable instructions, associated data structures, and program modules represent examples of program code for executing steps of the methods disclosed herein. The particular sequence of such executable instructions or associated data structures represents examples of corresponding acts for implementing the functions described in such steps or processes.

Various techniques preferably incorporated within some embodiments may be described using the following clause-based format.

A first set of solutions provides example embodiments of techniques that are relate to the cooling structure of the electronics box, which is described with regard to, for example, FIGS. 2-3E, FIGS. 8-11B, and FIGS. 13A to 17.

1. An electronics box for an in-flight entertainment system, comprising: a sealed enclosure including electronic components for the in-flight entertainment system disposed in a commercial passenger vehicle; and a cooling structure disposed on a surface of the sealed enclosure and includes: a fan introducing air from outside into the cooling structure, the air creating an air passage that is external to the sealed enclosure and extending along the surface of the sealed enclosure; one or more heat dissipation elements disposed in the air passage and configured to dissipate heat generated by the electronic components; and a duct cover covering the fan and the one or more heat dissipation elements and having an air inlet through which the air enters into the cooling structure.

2. The electronics box of clause 1, wherein the sealed enclosure further includes a thermally conductive structure through which the heat generated by the electronic components are collected and transferred to the heat dissipation element.

3. The electronics box of clause 1, further comprising an additional cooling structure disposed on another surface of the sealed structure.

4. The electronics box of clause 1, wherein the one or more heat dissipation elements include two heat sinks that have different sizes from each other.

5. The electronics box of clause 1, wherein the one or more heat dissipation elements include two heat sinks, each heat sink having fins, and the number of the fins of the two heat sinks are different form each other.

6. The electronics box of clause 1, wherein the one or more heat dissipation elements include two heat sinks having a same size or a same number of fins.

7. The electronics box of clause 1, wherein the sealed enclosure includes: a processor module including a first group of the electronic components and disposed to be in contact with the cooling structure; and a power supply module including a second group of the electronic components and disposed under the processor module.

8. The electronics box of clause 1, wherein the in-flight entertainment system includes at least one of a media playback device provided for each seat in the commercial passenger vehicle or a passenger electronic device.

9. The electronics box of clause 7, wherein the first group of the electronic components include a first electronic component and a second electronic component generating a greater amount of heat than the first electronic component, and wherein the second electronic component is in thermal contact with a first heat dissipation element disposed closer to the air inlet than an air outlet and the first electronic component is in thermal contact with a second heat dissipation element disposed closer to the air outlet than the air inlet.

10. The electronics box of clause 7, wherein the power supply module is surrounded by a housing including thermal conductive material and being in thermal contact with the second group of the electronic components.

11. An electronics box for an in-flight entertainment system, comprising: a first board including a first group of electronic components disposed on the first board and configured to provide power to the in-flight entertainment system disposed in a commercial passenger vehicle; a second board disposed over the first board and including a second group of electronic components disposed on the second board and configured to provide data to the in-flight entertainment system disposed in a commercial passenger vehicle; a cooling structure disposed over the second board and including a fan configured to introduce air from outside into the cooling structure and a heat dissipation element disposed in an air passage through which the air travels in the cooling structure and configured to dissipate heat that is transferred through a thermal conductive structure from the second group of electronic components.

12. The electronics box of clause 11, wherein the thermal conductive structure is disposed between an electronic component included in the second group and the heat dissipation element to form a thermally conductive path between the electronic component and the heat dissipation element.

13. The electronics box of clause 11, wherein the first board and the second board are included in a sealed structure that is free of any opening on an external surface of the sealed structure, the sealed structure configured to disallow for a substance to enter from outside into the sealed structure.

14. The electronics box of clause 13, wherein the cooling structure is disposed on a surface of the sealed structure and an additional cooling structure is disposed on another surface of the sealed structure.

15. The electronics box of clause 11, wherein the cooling structure has a duct cover that operates as a housing of the cooling structure and configured to force the air to move along the air passage.

16. The electronics box of clause 11, wherein an electronic component of the second group is arranged at a location of the second board that is determined based on at least one of an amount of heat generated by the electronic component, a sensitivity to heat of the electronic component, a location of the heat dissipation element, or a direction of the air travelling in the cooling structure.

17. A method for providing an electronics box for an in-flight entertainment system, comprising: configuring a sealed enclosure including electronic components for the in-flight entertainment system disposed in a commercial passenger vehicle, the electronic components configured to provide power or data to the in-flight entertainment system; disposing a cooling structure on a surface of the sealed enclosure, and wherein the cooling structure includes: a fan introducing air from outside into the cooling structure, the air creating an air passage that is external to the sealed enclosure and extending along the surface of the sealed enclosure; one or more heat dissipation elements disposed in the air passage and configured to dissipate heat generated by the electronic components; and a plenum cover covering the fan and the one or more heat dissipation elements and configured to force the air flowing along the air passage, the plenum cover having an air inlet through which the air enters into the cooling structure.

18. The method of clause 17, wherein the configuring the sealed enclosure comprise: configuring a processor module including a first group of the electronic components and disposed to be in contact with the cooling structure; and configuring a power supply module including a second group of the electronic components and disposed under the processor module.

19. The method of clause 18, wherein the disposing the cooling structure includes attaching the cooling structure to the sealed enclosure using screws or molding structures provided on the cooling structure.

20. The method of clause 18, wherein the configuring the sealed enclosure comprises: disposing a thermally conductive structure in the sealed enclosure through which the heat generated by the electronic components are collected and transferred to the heat dissipation element.

A second set of solutions provides example embodiments of techniques that are relate to the modularity aspect of the electronics box, which is described with regard to, for example, FIGS. 2-10, FIG. 12 and FIG. 18.

1. An electronics box for an in-flight entertainment system, comprising: a first module including a first group of electronic components for the in-flight entertainment system and having a housing accommodating a first board on which the first group of electronic components; and a second module detachably placed over the first module and having a second board on which a second group of electronic components for the in-flight entertainment system are disposed, the second board covered by a frame that forms a sealed enclosure with the housing, and wherein the first group of electronic components and the second group of electronic components are configured to provide power or data to the in-flight entertainment system that is located in the commercial passenger vehicle.

2. The electronics box of clause 1, wherein the second group of electronic components include one or more memory modules and one or more processor boards.

3. The electronics box of clause 1, wherein the frame has one or more windows operable between an open position and a closed position and configured to expose corresponding electronic components of the second group when the one or more windows are in the open position.

4. The electronics box of clause 3, wherein the corresponding electronic components of the second group are disposed to face in an outward direction of the electronics box and are accessible from outside when the one or more windows are in the open position.

5. The electronics box of clause 1, further comprising: a cooling structure that is disposed external to the sealed enclosure and including a fan introducing air from outside into the cooling structure, one or more heat dissipation elements disposed in an air passage through which the air travels, and a cover having an air inlet and covering the fan and the one or more heat dissipation elements.

6. The electronics box of clause 5, wherein the second group of electronic components include an electric component being in a thermal contact with the one or more heat dissipation elements through a thermally conductive structure disposed on the electric component.

7. The electronics box of clause 5, wherein the fan has a connector disposed outside of the sealed enclosure and accessible when the cover is open or removed.

8. The electronics box of clause 1, wherein the in-flight entertainment system includes at least one of a media playback device provided on each seat in the commercial passenger vehicle or a passenger electronic device.

9. The electronics box of clause 1, wherein the sealed enclosure is free of any opening on an external surface of the sealed enclosure and configured to disallow for a substance to enter from outside into the sealed enclosure.

10. An electronics box for an in-flight entertainment system, comprising: a housing configured to accommodate a first electronic component and a second electronic component that are disposed on a first board and configured to support the in-flight entertainment system; a third electronic component and a fourth electronic component that are disposed on a second board and configured to supply data to the in-flight entertainment system, the second board placed apart from the first board and arranged to face in an outward direction of the electronics box; and a frame covering the second board and having a top surface and side surfaces that are detachably attached to the housing, and wherein the first electronic component and the second electronic component are configured to supply power to the third electronic component and the fourth electronic component that are configured to provide data or power to at least one of an in-flight entertainment equipment and a passenger device that is located in the commercial passenger vehicle.

11. The electronics box of clause 10, wherein the housing has a bottom surface on which a thermal conductive structure is disposed to be in contact with the first board.

12. The electronics box of clause 10, wherein the first electronic component and the second electronic component are in thermal contacts with a bottom surface and a side surface of the housing, respectively.

13. The electronics box of clause 10, wherein a windows operable between an open position and a closed position is provided on the top surface of the frame to expose the third electronic component when the window is in the open position.

14. The electronics box of clause 10, wherein each of the first board and the second board correspond to a printed circuit board that allows an additional electronic component to be further added to the first board and the second board.

15. The electronics box of clause 10, wherein the frame and the housing are attached together to form a sealed enclosure that is free of any opening on an external surface of the sealed enclosure.

16. The electronics box of clause 15, further comprising: a cooling structure that is disposed external to the sealed enclosure and including a fan introducing air from outside into the cooling structure, one or more heat dissipation elements disposed in an air passage through which the air travels, and a cover having an air inlet and covering the fan and the one or more heat dissipation elements.

17. A method for providing an electronics box for an in-flight entertainment system, comprising: configuring a power supply module having a first board on which a first group of electronic components for the in-flight entertainment system are disposed; placing a processor module over the power supply module, the processor module having a second board on which a second group of electronic components for the in-flight entertainment system are disposed, and wherein the first group of electronic components and the second group of electronic components are configured to provide power or data to the in-flight entertainment system that is located in the commercial passenger vehicle.

18. The method of clause 17, wherein the power supply module and the processor module form together a sealed structure, and wherein the method further comprises: disposing a cooling structure to be external to the sealed structure, the cooling structure including a fan introducing air from outside into the cooling structure, one or more heat dissipation elements disposed in an air passage through which the air travels, and a cover having an air inlet and covering the fan and the one or more heat dissipation elements.

19. The method of clause 17, further comprising: configuring the processor module to include a thermally conductive structure through which the heat is collected and transferred to the one or more heat dissipation elements.

20. The method of clause 19, wherein the configuring the processor module includes: covering the second group of electronic components with a frame having one or more windows operable between an open position and a closed position and configured to expose corresponding electronic components of the second group when the one or more windows are in the open position.

Some of the disclosed embodiments can be implemented as devices or modules using hardware circuits, software, or combinations thereof. For example, a hardware circuit implementation can include discrete analog and/or digital components that are, for example, integrated as part of a printed circuit board. Alternatively, or additionally, the disclosed components or modules can be implemented as an Application Specific Integrated Circuit (ASIC) and/or as a Field Programmable Gate Array (FPGA) device. Some implementations may additionally or alternatively include a digital signal processor (DSP) that is a specialized microprocessor with an architecture optimized for the operational needs of digital signal processing associated with the disclosed functionalities of this application. Similarly, the various components or sub-components within each module may be implemented in software, hardware or firmware. The connectivity between the modules and/or components within the modules may be provided using any one of the connectivity methods and media that is known in the art, including, but not limited to, communications over the Internet, wired, or wireless networks using the appropriate protocols.

While this document contains many specifics, these should not be construed as limitations on the scope of an invention that is claimed or of what may be claimed, but rather as descriptions of features specific to particular embodiments. Certain features that are described in this document in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination can in some cases be excised from the combination, and the claimed combination may be directed to a sub-combination or a variation of a sub-combination. Similarly, while operations are depicted in the drawings in a particular order, this should not be understood as requiring that such operations be performed in the particular order shown or in sequential order, or that all illustrated operations be performed, to achieve desirable results.

Only a few implementations and examples are described and other implementations, enhancements and variations can be made based on what is described and illustrated in this patent document.

What is claimed is:

1. An electronics box for an in-flight entertainment system, comprising:
    a first module including a first group of electronic components for the in-flight entertainment system and having a housing accommodating a first board on which the first group of electronic components are disposed; and
    a second module detachably placed over the first module and having a second board on which a second group of electronic components for the in-flight entertainment system are disposed, the second board covered by a frame that forms a sealed enclosure with the housing, the second group of electronic components having characteristics that generate more heat than the first group of electronic components;
    a cooling structure that is disposed external to the sealed enclosure that is free of any opening on an external surface of the sealed enclosure and configured to disallow for a substance to enter from outside into the sealed enclosure, the cooling structure including a fan introducing air from outside into the cooling structure, and
    wherein the first group of electronic components and the second group of electronic components are configured to provide power or data to at least one of the in-flight entertainment system that is located in a commercial passenger vehicle, and
    wherein the second module is disposed closer to the cooling structure as compared to the first module.

2. The electronics box of claim 1, wherein the second group of electronic components include one or more memory modules and one or more processor boards.

3. The electronics box of claim 1, wherein the frame has one or more windows operable between an open position and a closed position and configured to expose corresponding electronic components of the second group when the one or more windows are in the open position.

4. The electronics box of claim 3, wherein the corresponding electronic components of the second group are disposed to face in an outward direction of the electronics box and are accessible from outside when the one or more windows are in the open position.

5. The electronics box of claim 1, a wherein the cooling structure further includes one or more heat dissipation elements disposed in an air passage through which the air travels and a cover having an air inlet and covering the fan and the one or more heat dissipation elements.

6. The electronics box of claim 5, wherein the second group of electronic components include an electric component being in a thermal contact with the one or more heat dissipation elements through a thermally conductive structure disposed on the electric component.

7. The electronics box of claim 5, wherein the fan has a connector disposed outside of the sealed enclosure and accessible when the cover is open or removed.

8. The electronics box of claim 1, wherein the in-flight entertainment system includes at least one of a media playback device provided on each seat in the commercial passenger vehicle or a passenger electronic device.

9. The electronics box of claim 1, wherein the sealed enclosure is free of any opening on an external surface of the sealed enclosure and configured to disallow for a substance to enter from outside into the sealed enclosure.

10. An electronics box for an in-flight entertainment system, comprising:
a housing configured to accommodate a first electronic component and a second electronic component that are disposed on a first board and configured to support the in-flight entertainment system;
a third electronic component and a fourth electronic component that are disposed on a second board and configured to support the in-flight entertainment system, the second board placed apart from the first board and arranged to face in an outward direction of the electronics box; and
a frame covering the second board and having a top surface and side surfaces that are detachably attached to the housing, the frame forming a sealed enclosure together with the housing and
a cooling structure that is disposed external to the sealed enclosure that is free of any opening on an external surface of the sealed enclosure and configured to disallow for a substance to enter from outside into the sealed enclosure, the cooling structure including a fan introducing air from outside into the cooling structure, and
wherein the first electronic component and the second electronic component are configured to supply power to the third electronic component and the fourth electronic component that are configured to provide data or power to at least one of an in-flight entertainment equipment and a passenger device that is located in a commercial passenger vehicle, and
wherein the second board is disposed closer to the cooling structure as compared to the first board.

11. The electronics box of claim 10, wherein the housing has a bottom surface on which a thermal conductive structure is disposed to be in contact with the first board.

12. The electronics box of claim 10, wherein the first electronic component and the second electronic component are in thermal contacts with a bottom surface and a side surface of the housing, respectively.

13. The electronics box of claim 10, wherein a window operable between an open position and a closed position is provided on the top surface of the frame to expose the third electronic component when the window is in the open position.

14. The electronics box of claim 10, wherein each of the first board and the second board correspond to a printed circuit board that allows an additional electronic component to be further added to the first board and the second board.

15. The electronics box of claim 14, wherein the cooling structure further includes one or more heat dissipation elements disposed in an air passage through which the air travels and a cover having an air inlet and covering the fan and the one or more heat dissipation elements.

16. A method for providing an electronics box for an in-flight entertainment system, comprising:
configuring a power supply module having a first board on which a first group of electronic components for the in-flight entertainment system are disposed;
placing a processor module over the power supply module, the processor module having a second board on which a second group of electronic components for the in-flight entertainment system are disposed, the processor module covered by a frame that forms a sealed enclosure together with the power supply module and the second group of electronic components having characteristics that generate more heat than the first group of electronic components;
disposing a cooling structure to be external to the sealed enclosure that is free of any opening on an external surface of the sealed enclosure and configured to disallow for a substance to enter from outside into the sealed enclosure, the cooling structure including a fan introducing air from outside into the cooling structure, and
wherein the first group of electronic components and the second group of electronic components are configured to provide power or data to the in-flight entertainment system that is located in a commercial passenger vehicle, and
wherein the second board is disposed closer to the cooling structure as compared to the first board.

17. The method of claim 16, wherein
the cooling structure further includes one or more heat dissipation elements disposed in an air passage through which the air travels and a cover having an air inlet and covering the fan and the one or more heat dissipation elements.

18. The method of claim 17, further comprising:
configuring the processor module to include a thermally conductive structure through which the heat is collected and transferred to the one or more heat dissipation elements.

19. The method of claim 18, wherein the configuring the processor module includes:
covering the second group of electronic components with a frame having one or more windows operable between an open position and a closed position and configured to expose corresponding electronic components of the second group when the one or more windows are in the open position.

* * * * *